(12) United States Patent
Jhan et al.

(10) Patent No.: US 12,199,097 B2
(45) Date of Patent: Jan. 14, 2025

(54) SEAM FREE ISOLATION STRUCTURES AND METHOD FOR MAKING THE SAME

(71) Applicant: Taiwan Semiconductor Manufacturing Co., Ltd., Hsinchu (TW)

(72) Inventors: Yi-Ruei Jhan, Hsinchu (TW); Kuan-Ting Pan, Hsinchu (TW); Kuo-Cheng Chiang, Hsinchu (TW); Kuan-Lun Cheng, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 543 days.

(21) Appl. No.: 17/481,668

(22) Filed: Sep. 22, 2021

(65) Prior Publication Data
US 2022/0328478 A1 Oct. 13, 2022

Related U.S. Application Data

(60) Provisional application No. 63/173,037, filed on Apr. 9, 2021.

(51) Int. Cl.
*H01L 27/092* (2006.01)
*H01L 21/02* (2006.01)
(Continued)

(52) U.S. Cl.
CPC ........ *H01L 27/092* (2013.01); *H01L 21/0228* (2013.01); *H01L 21/0259* (2013.01);
(Continued)

(58) Field of Classification Search
CPC .............. H01L 27/092; H01L 21/0228; H01L 21/0259; H01L 21/31111; H01L 21/76224; H01L 21/823807; H01L 21/823878; H01L 29/0665; H01L 29/42392; H01L 29/66742; H01L 29/78696; H01L 29/0673; H01L 29/0847; H01L 21/823437; H01L 29/165; H01L 29/267; H01L 29/7848; H01L 21/823481; H01L 27/088; H01L 29/66439; H01L 29/6653; H01L 29/66545; H01L 29/775; H01L 21/823418; H01L 21/823431; H01L 21/823468; H01L 27/0886; B82Y 10/00
See application file for complete search history.

(56) References Cited

U.S. PATENT DOCUMENTS 9,236,267 B2   1/2016   De et al.
9,502,265 B1   11/2016  Jiang et al.
9,520,466 B2   12/2016  Holland et al.
(Continued)

*Primary Examiner* — J. E. Schoenholtz
(74) *Attorney, Agent, or Firm* — Seed IP Law Group LLP

(57) ABSTRACT

A device includes a substrate, a first semiconductor channel over the substrate, and a second semiconductor channel over the substrate laterally offset from the first semiconductor channel. A first gate structure and a second gate structure are over and laterally surround the first and second semiconductor channels, respectively. A first inactive fin is between the first gate structure and the second gate structure. A dielectric feature over the inactive fin includes multiple layers of dielectric material formed through alternating deposition and etching steps.

20 Claims, 19 Drawing Sheets

(51) Int. Cl.
   *H01L 21/311*     (2006.01)
   *H01L 21/762*     (2006.01)
   *H01L 21/8238*    (2006.01)
   *H01L 29/06*      (2006.01)
   *H01L 29/423*     (2006.01)
   *H01L 29/66*      (2006.01)
   *H01L 29/786*     (2006.01)

(52) U.S. Cl.
   CPC .......... *H01L 21/31111* (2013.01); *H01L 21/76224* (2013.01); *H01L 21/823807* (2013.01); *H01L 21/823878* (2013.01); *H01L 29/0665* (2013.01); *H01L 29/42392* (2013.01); *H01L 29/66742* (2013.01); *H01L 29/78696* (2013.01)

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 10,879,116 B2 * | 12/2020 | Gouk ................ H01L 21/76879 |
| 10,943,779 B2 * | 3/2021 | Yieh ................ H01L 21/67213 |
| 11,869,889 B2 * | 1/2024 | Liao ................ H01L 21/823431 |
| 2021/0280451 A1 * | 9/2021 | Lee ................ H01L 21/02219 |
| 2023/0037719 A1 * | 2/2023 | Lin ................ H01L 29/42392 |
| 2023/0067354 A1 * | 3/2023 | Wei ................ H01L 23/5286 |
| 2023/0335552 A1 * | 10/2023 | Yang ................ H01L 27/092 |

\* cited by examiner

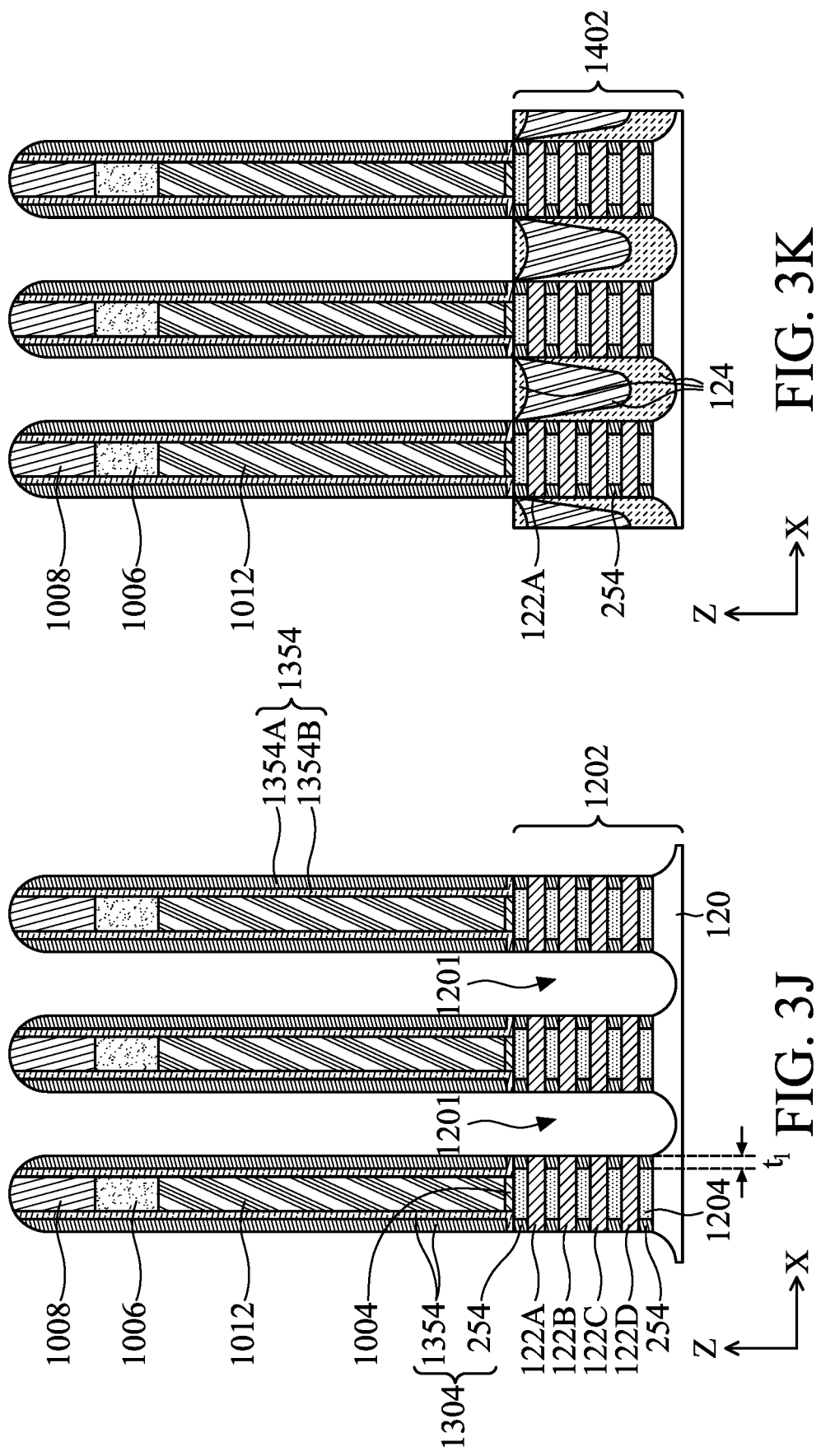

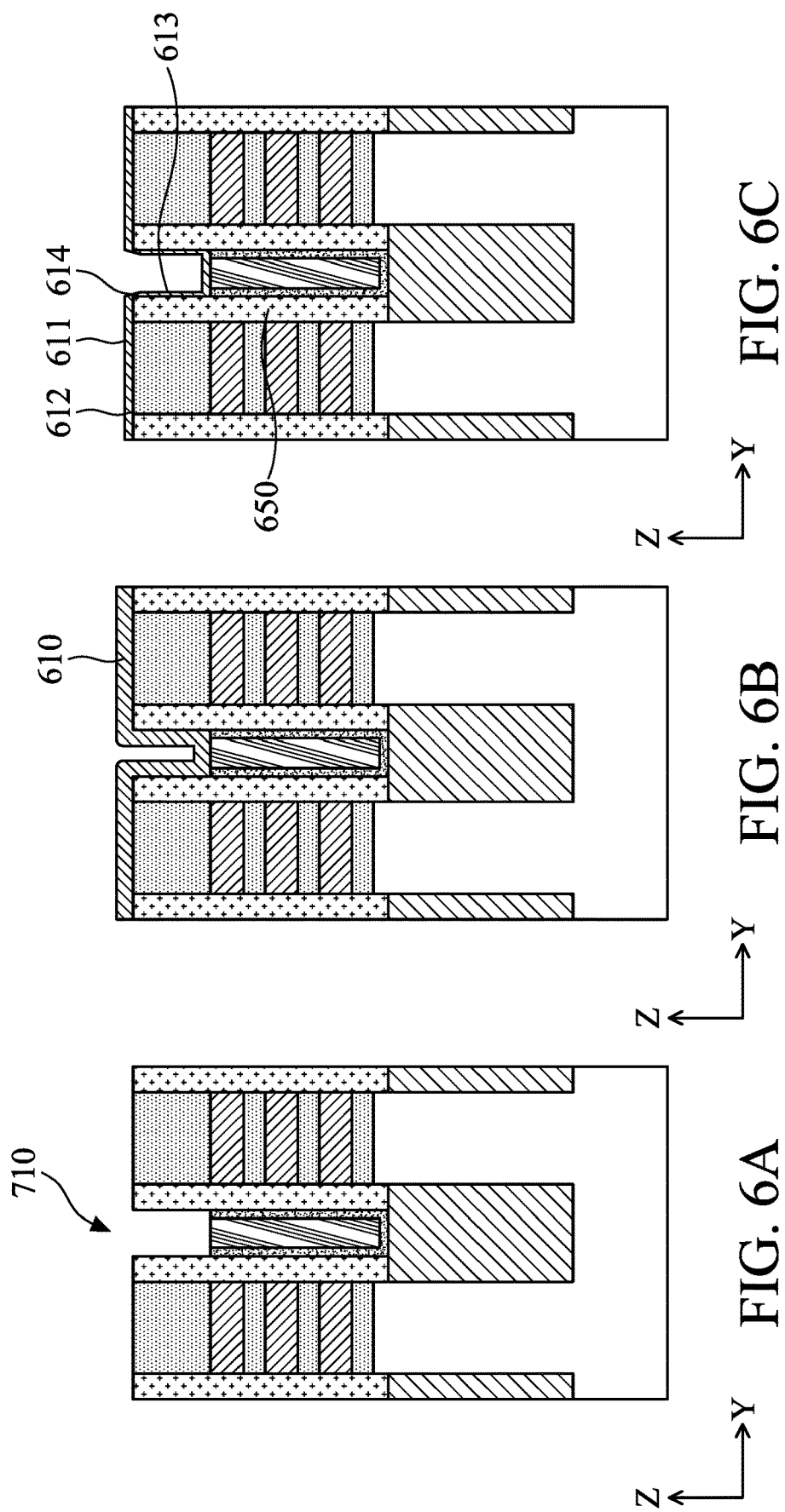

SEAM FREE ISOLATION STRUCTURES AND METHOD FOR MAKING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3M are views of various embodiments of an IC device at various stages of fabrication according to various aspects of the present disclosure.

FIGS. 6A-6E a schematic cross-sections of an IC device at various intermediate stages of fabrication according to an embodiment of the present disclosure.

DETAILED DESCRIPTION

Figure 1:
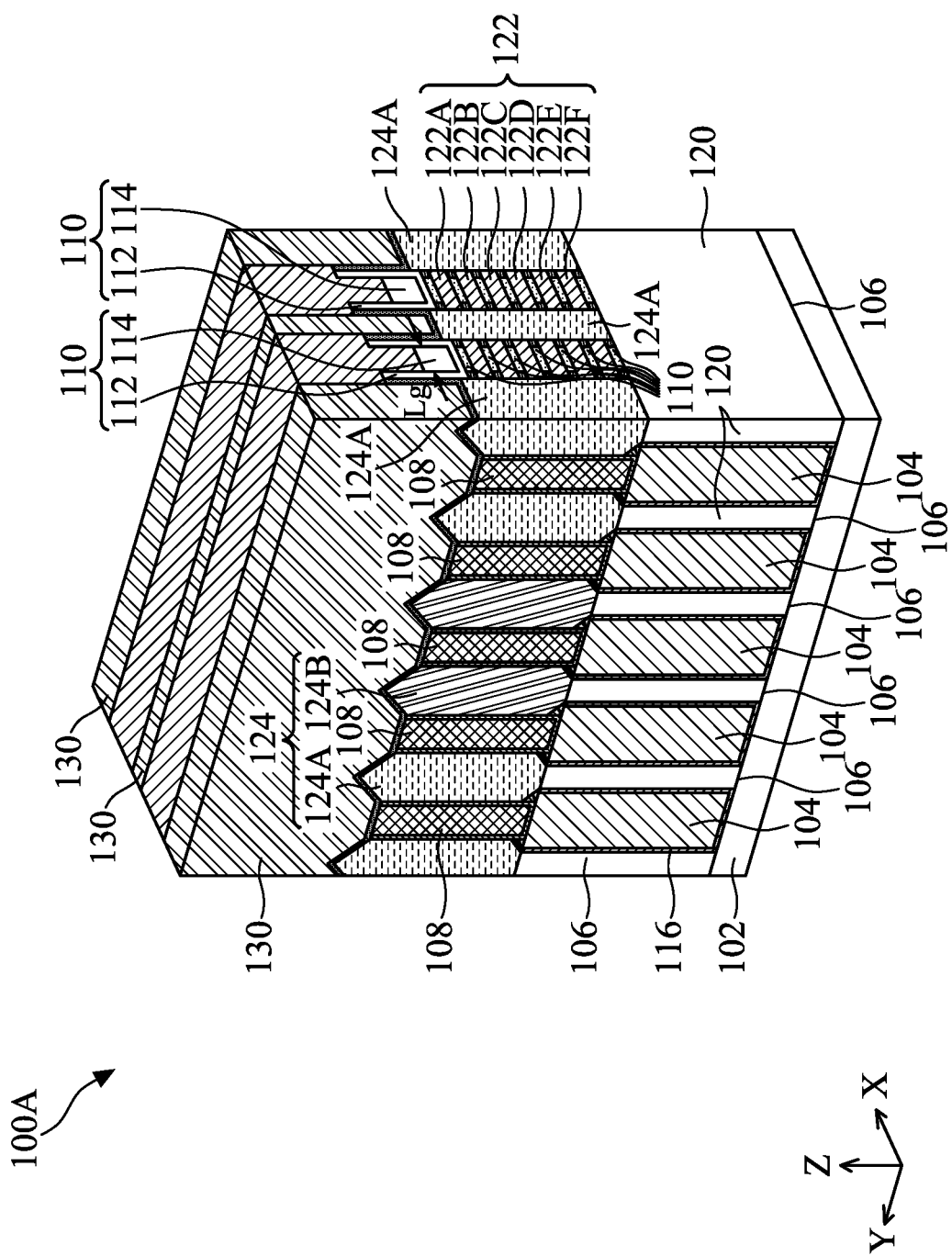
FIG. 1 is an isometric view of a semiconductor device, according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms. Generally, the term "substantially" indicates a tighter tolerance than the term "about." For example, a thickness of "about 100 units" will include a larger range of values, e.g., 70 units to 130 units (+/−30%), than a thickness of "substantially 100 units," which will include a smaller range of values, e.g., 95 units to 105 units (+/−5%). Again, such tolerances (+/−30%, +/−5%, and the like) may be process- and/or equipment-dependent, and should not be interpreted as more or less limiting than a person having ordinary skill in the art would recognize as normal for the technology under discussion, other than that "about" as a relative term is not as stringent as "substantially" when used in a similar context.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

The present disclosure is generally related to semiconductor devices, and more particularly to field-effect transistors (FETs), such as planar FETs, three-dimensional fin-line FETs (FinFETs), or gate-all-around (GAA) devices. In accordance with embodiments of the present disclosure, semiconductor device structures, e.g., isolation structures formed using hard masks of dielectric materials, e.g., high-k and low-k dielectric materials are described. Examples of isolation structures include inactive fins including dielectric material structures that electrically isolate portions of adjacent conductive structures, such as adjacent gate structures from each other or adjacent source/drain structures from each other. The processes for forming the semiconductor device structures in accordance with the present disclosure do so utilizing gate isolation structures or hybrid fins, e.g., dielectric features, designed to protect the inactive fins during semiconductor processing steps, that are free of seams or voids that could otherwise negatively impact the performance of the isolation structures and the semiconductor device structures formed using such isolation structures. Such isolation structures are formed by a sequence of deposition and etching steps that result in isolation structures free of seams or voids. As used herein, the term "high-k"

refers to a high dielectric constant. In some embodiments, high-k refers to a dielectric constant that is greater than the dielectric constant of $SiO_2$ (e.g., greater than 7.0). As used herein, the term "low-k" refers to a small dielectric constant. In some embodiments, low-k refers to a dielectric constant that is less than the dielectric constant of $SiO_2$ (e.g., less than 7.0).

Fins associated with fin field effect transistors (finFETs) or nano-sheet FETs may be patterned by any suitable method. For example the fins of a finFET or a nano-sheet FET, e.g., a gate all around (GAA) transistor structure may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 is an isometric view of a device 100A, according to some embodiments. Device 100A can be a collection of one or more FinFETs, a collection of one or more nano-sheet FETs, a collection of one or more nano-wire FETs, or collection of one or more of any other type of FETs. Device 100A can be included in a microprocessor, memory cell, or other integrated circuit. The view of device 100A in FIG. 1 is shown for illustration purposes and may not be drawn to scale.

As shown in the embodiment of FIG. 1, device 100A is formed on a substrate 102 and includes one or more field-effect transistors (FETs) 106 and multiple isolation structures 108 separating portions of one FET 106 from portions of an adjacent FET 106. Device 100A further includes multiple shallow trench isolation (STI) regions 104, multiple gate structures 110, and multiple interlayer dielectric (ILD) structures 130 formed on opposite sides of two gate structures 110 illustrated in FIG. 1.

Substrate 102 is a physical material on which FETs 106 and isolation structures 108 are formed. Substrate 102 can be a semiconductor material, such as silicon. In some embodiments, substrate 102 can include a crystalline substrate, such as a silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements of the FETs (e.g., p-type substrate or n-type substrate). In some embodiments, substrate 102 can be doped with p-type dopants (e.g., boron, indium, aluminum, or gallium) or n-type dopants (e.g., phosphorus or arsenic). In some embodiments, substrate 102 can include a glass substrate. In some embodiments, substrate 102 can include a flexible substrate made of, for example, plastic.

In FIG. 1, STI regions 104 provide electrical isolation to FETs 106 from each other and from neighboring active and passive elements (not illustrated herein) integrated with or deposited onto substrate 102. STI regions 104 can be made of a dielectric material. In some embodiments, STI regions 104 can include silicon oxide ($SiO_x$), silicon nitride ($SiN_x$), silicon oxynitride (SiON), fluorine-doped silicate glass (FSG), a low-k dielectric material, and/or other suitable electrically insulating material. In some embodiments, STI regions 104 can include a multi-layered structure. In some embodiments, a liner 116, made of a suitable insulating material, can be placed between STI region 104 and the adjacent FETs 106.

As illustrated in FIG. 1, each FET 106 is a vertical structure traversing along an x-axis and through gate structures 110. In some embodiments, FET 106 can be a vertical structure oriented along <110>, <111>, or <100> crystal direction of substrate 102. In the embodiment illustrated in FIG. 1, FETs 106 includes a buffer region 120 formed over substrate 102. In the embodiment of FIG. 1, FETs 106 also include a channel region 122 formed over buffer region 120. Channel region 122 includes at least one channel layer that is made of at least one semiconductor layer. For example, FIG. 1 illustrates FETs 106 including six channel layers 122A-122F, where each of the six channel layers can include at least a silicon layer or a silicon germanium layer. Although FIG. 1 shows six channel layers 122A-122F, any number of channel layers can make up channel region 122. FETs 106 horizontally (e.g., in the x-direction) traverse through gate structure 110, so a portion of channel region 122 is present under gate structure 110 and another portion of channel region 122 (covered by source-drain region 124; not shown in FIG. 1) extends horizontally (e.g., in the x-direction) outside gate structure 110. In some embodiments, device 100A can be a collection of one or more FinFETs, where a top surface and side surfaces of the portion of channel regions 122 under gate structure 110 can be in physical contact with gate structure 110. In some embodiments, as shown in FIG. 1, device 100A is a collection of one or more nano-sheet FETs where a top surface, side surfaces, and the bottom surface of the portion of channel regions 122 under gate structure 110 can be in physical contact with gate structure 110. In some embodiments, device 100A is a collection of one or more nano-wire FETs where a circumferential surface of the portion of channel regions 122 under gate structure 110 can be in physical contact with gate structure 110.

In some embodiments, device 100A can be a collection of one or more nano-sheet FETs or a collection of one or more nano-wire FETs, where channel region 122 can include a first portion with alternating channel layers (not shown in FIG. 1; buried within source-drain 124) and a second portion with the alternating channel layers (e.g., channel layers 122A-122F). The second channel layers from the first portion of channel region 122 can extend through the second portion of channel region 122. Gate structure 110 can be formed over the second portion of the channel region 122. In some embodiments, gate structure 110 can surround the second channel layers of the second portion of channel region 122.

FETs 106 further include a source-drain region 124 formed over a portion of channel region 122 and over buffer region 120. For example, source-drain 124 can wrap around the portion of channel region 122 that is horizontally (e.g., in the x-direction) outside gate structure 110, e.g., not under the gate structure 110. In some embodiments, channel region 122 and source-drain region 124 can be positioned above top surfaces of STI regions 104. In some embodiments, bottom surfaces of channel region 122 and bottom surfaces of source-drain region 124 can be above or substantially coplanar with top surfaces of STI regions 104.

Channel regions 122 can be current-carrying structures for device 100A. Source-drain region 124 that covers portions of channel region 122 can be configured to function as source/drain (S/D) regions of device 100A. Channels of device 100A can be formed in portions of channel region 122 under gate structures 110.

Each of buffer region 120 and channel region 122 can include materials similar to substrate 102. For example, each of buffer region 120 and channel region 122 can include a semiconductor material having lattice constant substantially closed to (e.g., lattice mismatch within 1%) that of substrate 102. In some embodiments, each of buffer region 120 and channel region 122 can include material similar to (e.g., lattice mismatch within 1%) or different from each other. In some embodiments, buffer region 120 can include an elementary semiconductor, such as silicon and germanium. In some embodiments, channel region 122 can include an alloy semiconductor, such as silicon germanium carbide, silicon germanium, gallium arsenic phosphide, gallium indium phosphide, gallium indium arsenide, gallium indium arsenic phosphide, aluminum indium arsenide, and aluminum gallium arsenide.

Each of buffer region 120 and channel region 122 can be p-type, n-type, or un-doped. In some embodiments, a portion of channel region 122 under gate structure 110 and another portion of channel region 122 horizontally (e.g., in the x-direction) outside gate structure 110 can have different doping type. For example, a portion of channel region 122 under gate structure 110 can be un-doped, and another portion of channel region 122 that is outside gate structure 110 can be n-type doped. In some embodiments, buffer region 120 and a portion of channel region 122 under gate structure can have same doping type.

Source-drain region 124 can include an epitaxially-grown semiconductor material. In some embodiments, the epitaxially-grown semiconductor material can be the same material as the material of substrate 102. In some embodiments, the epitaxially-grown semiconductor material can include a different material from the material of substrate 102. The epitaxially-grown semiconductor material can include: (i) a semiconductor material, such as germanium (Ge) and silicon (Si); (ii) a compound semiconductor material, such as gallium arsenide and aluminum gallium arsenide; or (iii) a semiconductor alloy, such as silicon germanium (SiGe) and gallium arsenide phosphide. In some embodiments, device 100A can include a FET 106 having a first source-drain region 124 (e.g., source-drain region 124A) and another FET 106 having a second source-drain region 124 (e.g., source-drain region 124B), where the first and the second source-drain regions 124 (e.g., 124A and 124B) can be made of the same or different semiconductor material.

Source-drain region 124 can be p-type or n-type doped. In some embodiments, source-drain region 124 can be doped with p-type dopants, such as boron, indium, gallium, zinc, beryllium, and magnesium. In some embodiments, source-drain region 124 can be doped with n-type dopants, such as phosphorus, arsenic, silicon, sulfur, and selenium. In some embodiments, each of n-type source-drain region 124 can have a plurality of n-type sub-regions. Except for the type of dopants, the plurality of n-type sub-regions can be similar to the respective plurality of p-type sub-regions, in thickness, relative Ge concentration with respect to Si, dopant concentration, and/or epitaxial growth process conditions.

Source-drain region 124 can be grown over portions of channel regions 122 that extend beyond gate structure 110 and/or buffer regions 120 via an epitaxial growth process. In some embodiments, source-drain regions 124 can be epitaxially grown on portions of FETs 106 that are horizontally (e.g., in the x-direction) outside gate structures 110. The epitaxial growth process for source-drain region 124 can include (i) chemical vapor deposition (CVD), such as low pressure CVD (LPCVD), rapid thermal chemical vapor deposition (RTCVD), metal-organic chemical vapor deposition (MOCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, source-drain region 124 can be grown by an epitaxial deposition/partial etch process, which repeats the epitaxial deposition/partial etch process at least once. Such repeated deposition/partial etch process is also called a "cyclic deposition-etch (CDE) process." In some embodiments, source-drain region 124 can be grown by selective epitaxial growth (SEG), where an etching gas can be added to promote the selective growth of semiconductor material on the exposed surfaces of FETs 106, but not on insulating material (e.g., dielectric material of STI regions 104).

Doping of source-drain regions 124 can be achieved by introducing one or more precursors during the above-noted epitaxial growth process. For example, source-drain region 124 can be in-situ p-type doped during the epitaxial growth process using p-type doping precursors, such as diborane ($B_2H_6$) and boron trifluoride ($BF_3$). In some embodiments, source-drain region 124 can be in-situ n-type doped during an epitaxial growth process using n-type doping precursors, such as phosphine ($PH_3$) and arsine ($AsH_3$).

In FIG. 1, isolation structures 108 are vertical structures formed over STI region 104 and placed horizontally (e.g., in the y-direction) between FETs 106. Isolation structures 108 can include a dielectric stack to electrically insulate multiple FETs 106 from one another. In some embodiments, the dielectric stacks of the isolation structures 108 can be vertical extensions of STI region 104 to electrically insulate portions of FETs 106. For example, isolation structures 108 can be-include dielectric inactive fin structures having dielectric features on top of the inactive fin structures and placed between two FETs 106 to isolate, for example, metal gates of the two FETs 106 from one another. In some embodiments, each of FETs 106 and each of isolation structures 108 can be alternatively and horizontally (e.g., in the y-direction) placed next to each other. In some embodiments, isolation structures 108 can include fin structures to isolate source-drain regions 124 of the two FETs 106 from one another. Isolation structures 108 can have a vertical dimension (e.g., height) that is substantially equal to or greater than a height of channel region 122. In some embodiments, isolation structures 108 can have horizontal dimensions (e.g., width along the y-direction) that are substantially equal to or less than a spacing between two horizontally (e.g., in the y-direction) adjacent FETs 106.

As shown in FIG. 1, gate structure 110 is a vertical structure traversing along a y-axis and through one or more FETs 106. Although FIG. 1 shows two gate structures 110 traversing six FETs 106, any number of gate structures 110 can be included in device 100A, where each of the gate structures 110 can be parallel to each other and can traverse any number of FETs 106. In some embodiments, gate structure 110 can surround a portion of a top surface and a portion of side surfaces of channel region 122 (e.g., when device 100A is a collection of one or more FinFETs). In some embodiments, gate structure 110 can surround a portion of a top surface, a portion of side surfaces, and a portion of a bottom surface of channel region 122 (e.g., when device 100A is a collection of one or more nano-sheet FETs) or can surround a portion of the circumferential surface (e.g., when device 100A is a collection of one or more nano-wire FETs). Gate structure 110 can include a gate electrode 114 and a dielectric layer 112 disposed between the surrounded channel region 122 and gate electrode 114. In some embodiments, gate structure 110 can have a horizontal dimension (e.g., gate length) $L_g$ that ranges from about 5 nm to about 30 nm. In some embodiments, gate structure 110 can be formed by a gate replacement process. In some embodiments, gate structure 110 can be formed by a gate first process.

Dielectric layer 112 can be adjacent to and in contact with gate electrode 114. Dielectric layer 112 can have a thickness in a range from about 1 nm to about 5 nm. Dielectric layer 112 can include silicon oxide and may be formed by CVD, atomic layer deposition (ALD), physical vapor deposition (PVD), e-beam evaporation, or any other suitable process. In some embodiments, dielectric layer 112 can include (i) a layer of silicon oxide, silicon nitride, and/or silicon oxynitride, (ii) a high-k dielectric material, such as aluminum oxide ($Al_2O_3$), hafnium oxide ($HfO_2$), hafnium aluminum oxide ($HfAlO_x$), titanium oxide ($TiO_2$), hafnium zirconium oxide ($HfZrO_x$), tantalum oxide ($Ta_2O_3$), hafnium silicate ($HfSiO_4$), hafnium silicon oxide ($HfSiO_x$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers may be formed by ALD and/or other suitable methods. In some embodiments, dielectric layer 112 can include a single layer or a stack of insulating material layers. Based on the disclosure herein, other materials and formation methods for dielectric layer 112 are within the scope and spirit of this disclosure.

Gate electrode 114 can include a gate work function metal layer (not shown) and a gate metal fill layer (not shown). In some embodiments, the gate work function metal layer can be disposed on dielectric layer 112. The gate work function metal layer can include a single metal layer or a stack of metal layers. The stack of metal layers can include metals having work functions similar to or different from each other. In some embodiments, the gate work function metal layer can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. The gate work function metal layer can be formed using a suitable process, such as ALD, CVD, PVD, plating, or combinations thereof. In some embodiments, the gate work function metal layer can have a thickness in a range from about 2 nm to about 15 nm. Based on the disclosure herein, other materials, formation methods, and thicknesses for the gate work function metal layer are within the scope and spirit of this disclosure.

The gate metal fill layer of gate electrode 114 can include a single metal layer or a stack of metal layers. The stack of metal layers can include metals different from each other. In some embodiments, the gate metal fill layer can include a suitable conductive material, such as Ti, silver (Ag), Al, titanium aluminum nitride (TiAlN), tantalum carbide (TaC), tantalum carbonitride (TaCN), tantalum silicon nitride (TaSiN), manganese (Mn), zirconium (Zr), titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. The gate metal fill layer can be formed by ALD, PVD, CVD, or other suitable deposition process. Based on the disclosure herein, other materials and formation methods for the gate metal fill layer are within the scope and spirit of this disclosure.

In FIG. 1, ILD structure 130 includes one or more insulating layers to provide electrical isolation to structural elements it surrounds or covers—for example, gate structure 110, source-drain regions 124, and source/drain contact structures (not shown in FIG. 1) that will be formed adjacent to the gate structures 110. Each of the insulating layers can include an insulating material, such as silicon oxide, silicon dioxide ($SiO_2$), silicon oxycarbide (SiOC), silicon oxynitride (SiON), silicon oxy-carbon nitride (SiOCN), or silicon carbonitride (SiCN) that can be formed by low pressure chemical vapor deposition (LPCVD), plasma enhanced chemical vapor deposition (PECVD), chemical vapor deposition (CVD), flowable CVD (FCVD), or high-aspect-ratio process (HARP). ILD structure 130 can have a thickness (e.g., along the z-direction) in a range from about 50 nm to about 200 nm. Based on the disclosure herein, other insulating materials, thicknesses, and formation methods for ILD structure 130 are within the scope and spirit of this disclosure.

Figure 2:
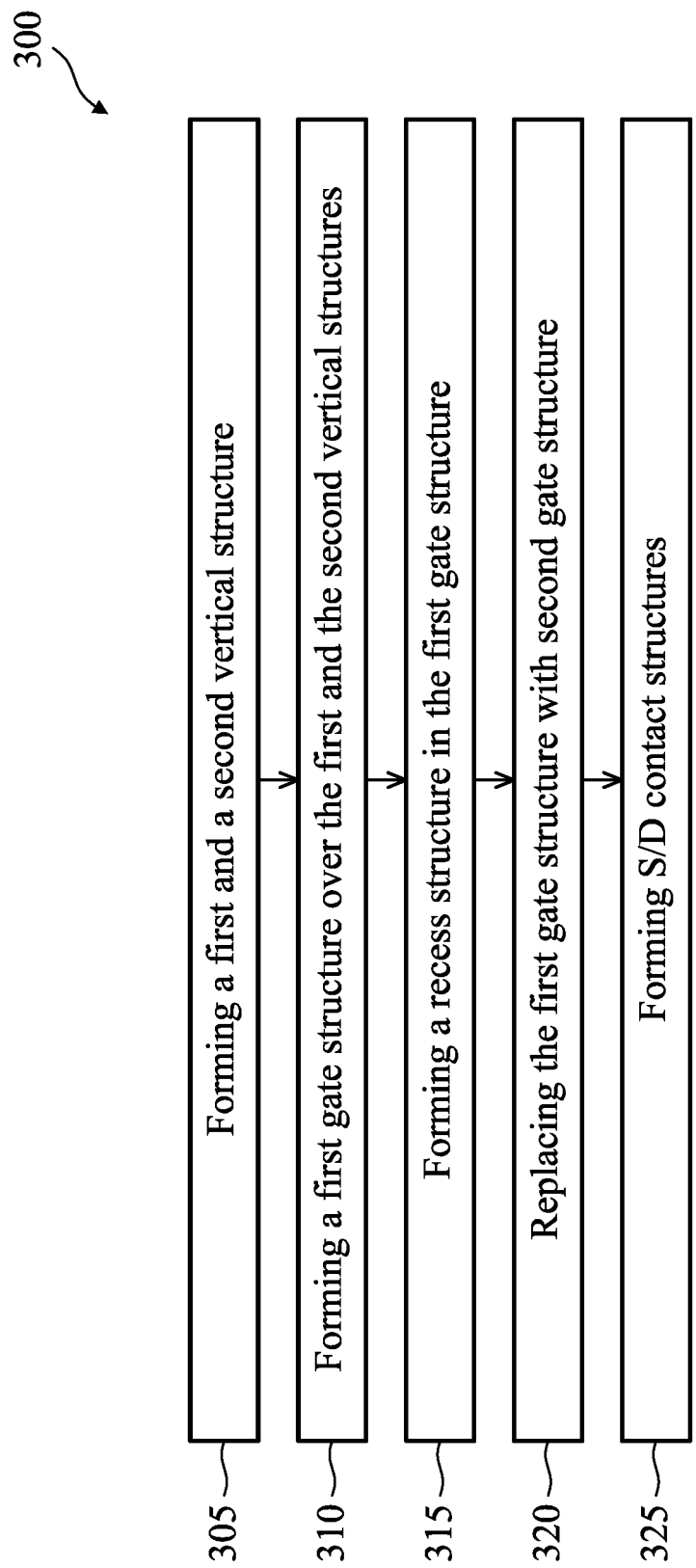
FIG. 2 is a flowchart illustrating a method of fabricating a semiconductor device according to various aspects of the present disclosure.

FIG. 2 is a flow diagram of a method 300 for fabricating device 100A as described with reference to FIG. 1, according to some embodiments of the present disclosure. For illustrative purposes, the operations illustrated in FIG. 2 will be described with reference to an example fabrication process for fabricating device 100A with reference to FIGS. 3A-3M, which are isometric or cross-sectional views of device 100A at various stages of its fabrication, according to some embodiments. Operations can be performed in a different order or not performed depending on specific applications. It should be noted that method 300 does not manufacture a complete device 100A. Accordingly, it is understood that additional processes may be provided before, during, and after method 300, and that some other processes may only be briefly described herein. Elements in FIGS. 3A-3M with the same annotations as elements in FIG. 1 are described above.

Figure 3A:
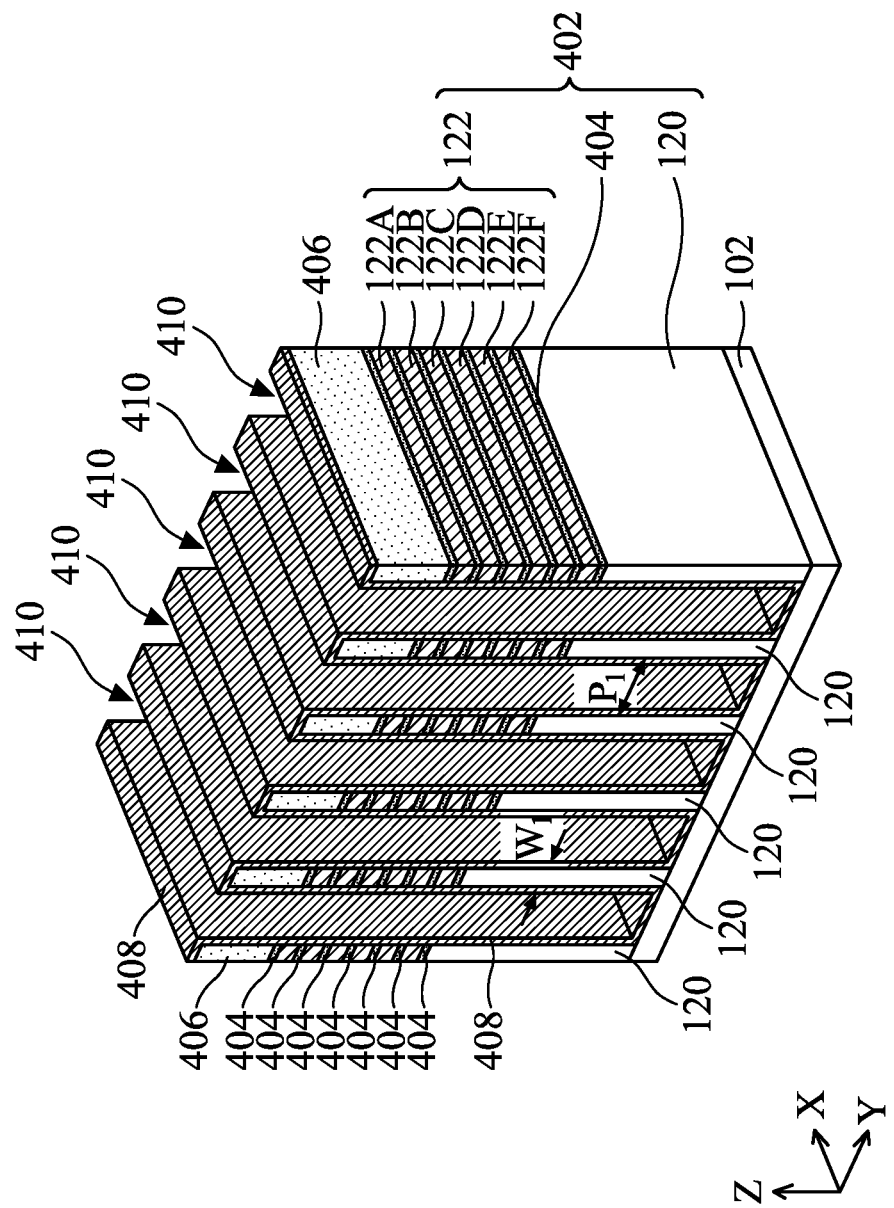
Figure 3B:
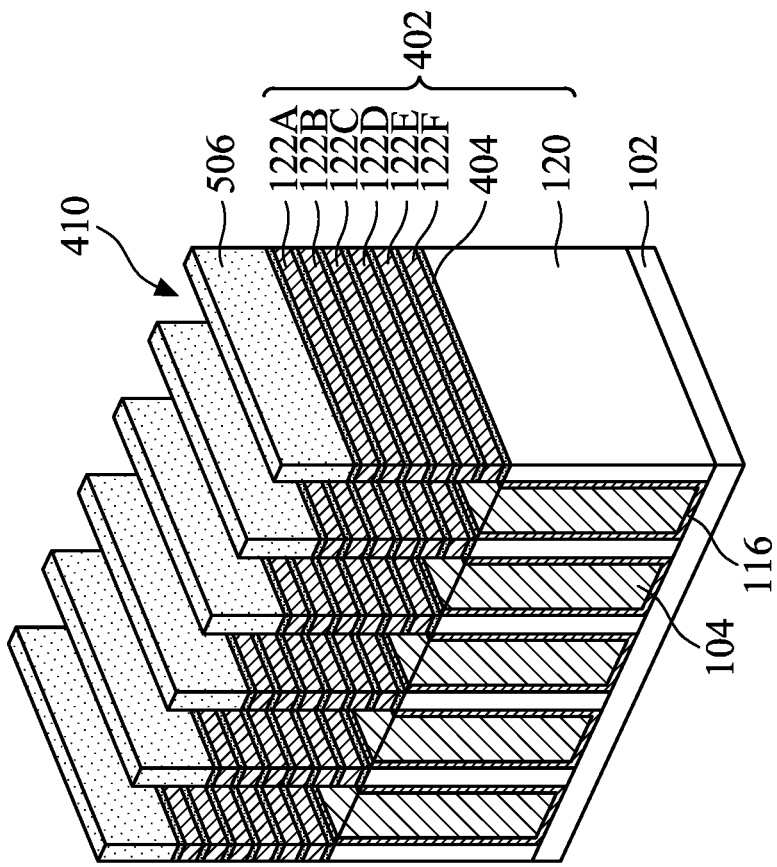
Figure 3C:
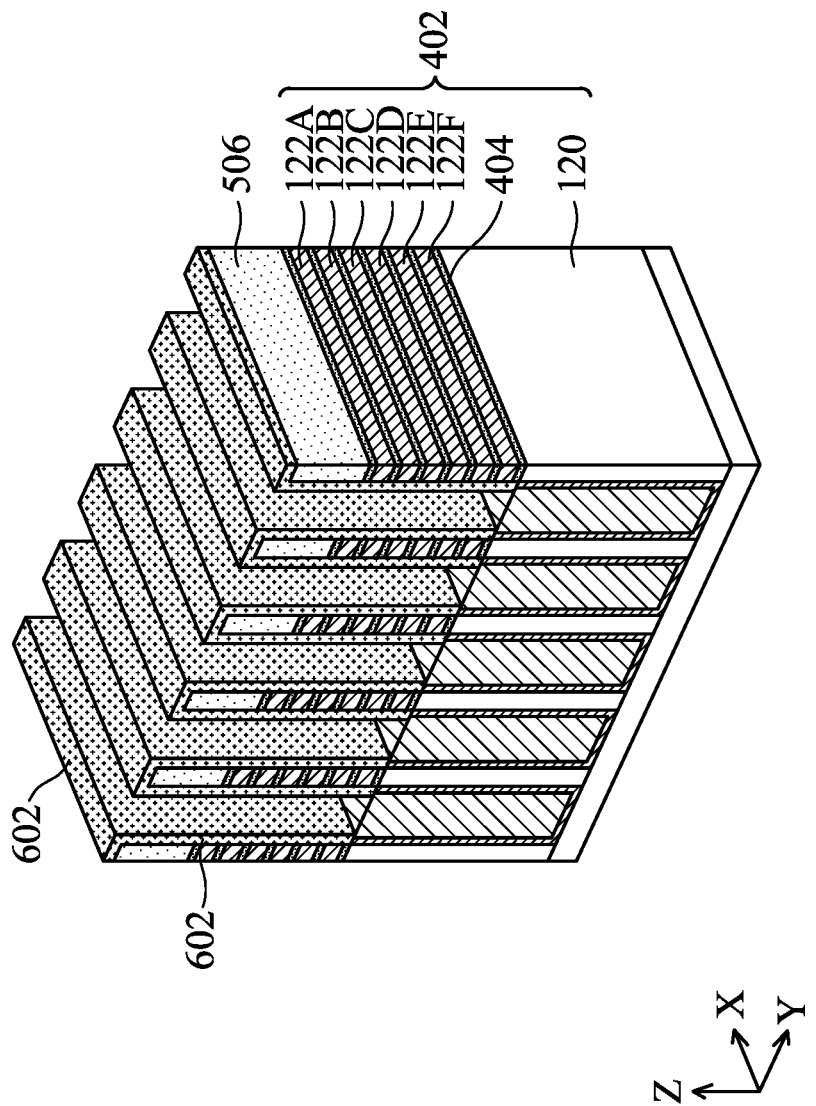
Figure 3D:
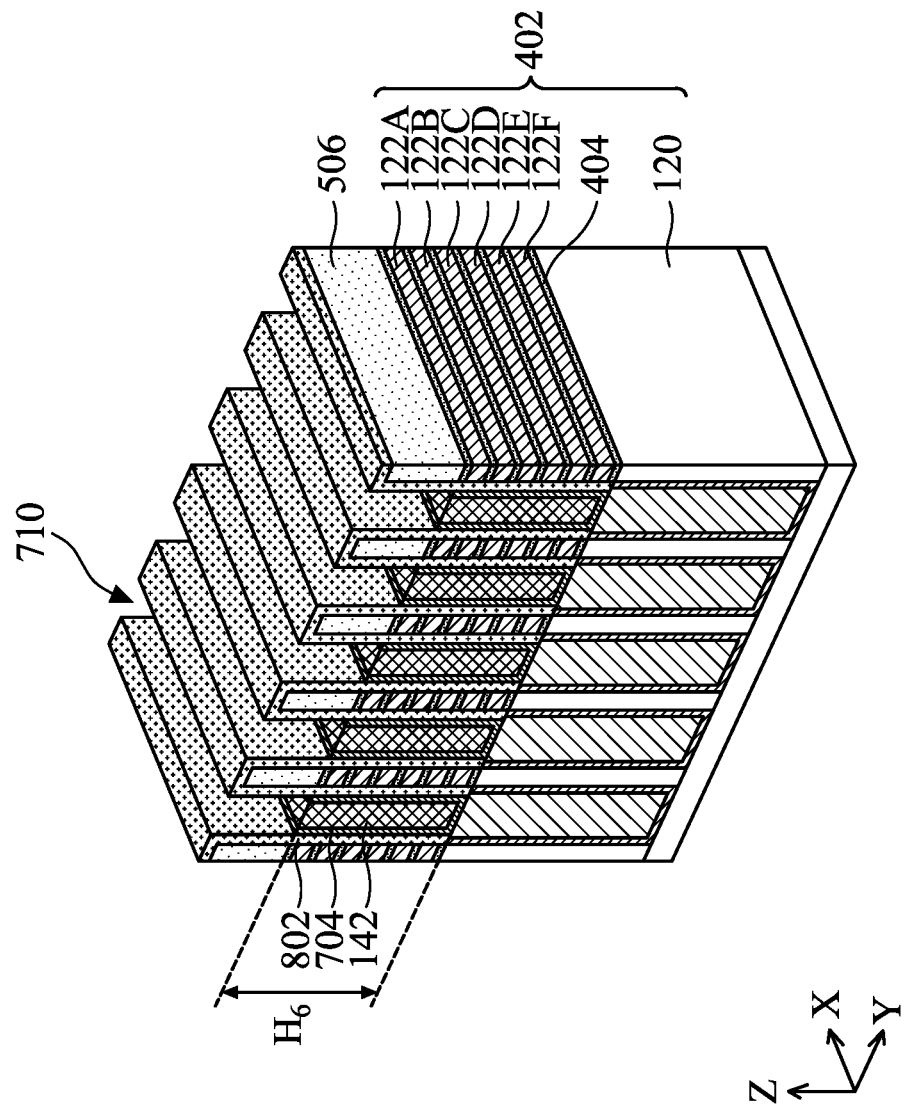

In operation 305, a first and a second vertical structure are formed on a substrate. For example, as shown in FIG. 3F, multiple vertical structures 402 (e.g., fin stacks) and multiple vertical structures 902 (e.g., isolation structures 108 of FIG. 1) can be respectively formed on substrate 102. FIGS. 3A and 3G are isometric views of partially fabricated structures that can be used to describe the fabrication stages of operation 305. As shown in FIG. 3A, the process of forming vertical structures 402 can include forming a patterned hard mask layer 406 over substrate 102 and forming recess structures 410 within substrate 102 via an etching process using patterned hard mask layer 406. The process of forming patterned hard mask layer 406 can include patterning a blanket film using a lithography process and/or an etching process. By way of example and not limitation, the blanket film can be silicon nitride, silicon carbon nitride, silicon oxide, or any other suitable material, and can be deposited using, LPCVD, RTCVD, ALD, or PECVD. The etching process for forming recess structures 410 can be a dry etch process, a wet etch process, or a combination thereof. In some embodiments, the dry etch process can use reactive ion etching using a chlorine or fluorine based etchant. Each vertical structure 402 can include buffer region 120 made of a same or similar material as substrate 102. In some embodiments, vertical structure 402 can have a width $W_1$ ranging from about 3 nm to about 50 nm. In some embodiments, vertical structure 402 can have a width $W_1$ ranging from about 5 nm to about 40 nm. In some embodiments, a spacing $P_1$ (e.g., pitch size) between two adjacent vertical structures 402 can range from about 14 nm to about 40 nm. Based on the disclosure herein, any width and spacing associated with vertical structures 402 are within the scope and spirit of this disclosure.

In some embodiments, the process of forming vertical structure 402 can further include epitaxially growing at least one channel layer (e.g., 122A-122F) on substrate 102 to form channel region 122, before forming patterned hard mask layer 406. By way of example and not limitation, each channel layer 122A-122F can include Si or SiGe and can be grown using an epitaxial growth process, such as LPCVD, RTCVD, MOCVD, ALD, PECVD, or a combination thereof. Although FIG. 3A shows six channel layers 122A-122F, any number of channel layers can be epitaxially grown on substrate 102 to form channel region 122. In some embodiments, multiple sacrificial layers 404 can be epitaxially grown and interleaved with the epitaxially grown channel layers. In some embodiments, sacrificial layer 404 can include SiGe. In the embodiment illustrated in FIG. 2C, the uppermost sacrificial layer 404 has a dimension in the Z direction, e.g., a height, that is similar to the height of other sacrificial layers 404 below the uppermost sacrificial layer. In another embodiment the uppermost sacrificial layer 404 has a height in the Z-direction that is greater than the height of the other sacrificial layers 404 below the uppermost sacrificial layer. For example, the height of the uppermost sacrificial layer 404 has a height that is similar in dimension to the height of hard mask layer 406. In such embodiment, uppermost sacrificial layer 404 serves as a hard mask similar to hard mask 406 and replaces hard mask 406. The description herein with respect to further processing of hard masks 406 applies to the upper sacrificial layer 404 when the upper sacrificial layer replaces the hard mask 406. In some embodiments, each vertical structure 402 can include buffer region 120, channel region 122, and sacrificial layers 404.

Further, in operation 305, STI regions 104 are formed. For example, STI regions 104 can be formed as described with reference to FIGS. 3A and 3D. In some embodiments, as shown in FIG. 3D, the process of forming STI region 104 can include depositing a protective layer 408 (e.g., conformally) over recess structures 410. Protective layer 408 can include a nitride material (e.g., $SiN_x$) and can be deposited using, for example, ALD or LPCVD. Furthermore, as shown in FIG. 3B, the process of forming STI regions 104 can include depositing an insulating material over recess structures 410, annealing the insulating material, polishing (e.g., chemical mechanical polishing (CMP)) the annealed insulating material, and recessing the polished insulating material to form STI regions 104. In some embodiments, protective layer 408 can prevent oxidation of vertical structures 402 during the annealing of the insulating material. By way of example and not limitation, the insulating material can include, silicon oxide, silicon nitride, silicon oxynitride, fluoride-doped silicate glass (FSG), or a low-k dielectric material. In some embodiments, the process of depositing the insulating material can include any deposition method suitable for flowable dielectric materials (e.g., flowable silicon oxide). For example, flowable silicon oxide can be deposited for STI regions 104 using a flowable CVD (FCVD) process. The FCVD process can be followed by a wet anneal process. In some embodiments, the process of depositing the insulating material can include depositing a low-k dielectric material to form liner 116.

The annealing of the insulating material can include annealing the deposited insulating material in a steam at a temperature in a range from about 200° C. to about 700° C. for a period in a range from about 30 min to about 120 min. The anneal process can be followed by the polishing process that can remove portions of the layer of the insulating material. The polishing process can further remove all or portions of patterned hard mask layer 406. When all of patterned hard mask 406 is removed, the uppermost sacrificial layer 404 is exposed. As noted above, in some embodiments, the uppermost sacrificial layer 404 can have a height that is similar to the height of hard mask 406. Removing only a portion of patterned hard mask 406 forms patterned hard mask layer 506, where a top surface of the insulating material after the polishing process can be substantially coplanarized with a top surface of patterned hard mask layer 506. The polishing process can be followed by the etching process to recess the polished insulating material to form STI regions 104. The recessing of the polished insulating material can be performed, for example, by a dry etch process, a wet etch process, or a combination thereof which has higher selectivity for the STI region material compared to the hard mask of uppermost sacrificial layer 404. In some embodiments, the dry etch process for recessing the polished insulating material can include using a plasma dry etch with a gas mixture that can include octafluorocyclobutane ($C_4F_8$), argon (Ar), oxygen ($O_2$), helium (He), fluoroform ($CHF_3$), carbon tetrafluoride ($CF_4$), difluoromethane ($CH_2F_2$), chlorine ($Cl_2$), hydrogen bromide (HBr), or a combination thereof with a pressure ranging from about 1 mTorr to about 5 mTorr. In some embodiments, the wet etch process for recessing the polished insulating material can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process for recessing the polished insulating material can include using an etch process that uses ammonia ($NH_3$) and hydrofluoric acid (HF) as etchants and inert gases, such as Ar, xenon (Xe), He, or a combination thereof. In some embodiments, the flow rate of HF and $NH_3$ used in the etch process can each range from about 10 sccm to about 100 sccm (e.g., about 20 sccm, 30 sccm, or 40 sccm). In some embodiments, the etch process can be performed at a pressure ranging from about 5 mTorr to about 100 mTorr (e.g., about 20 mTorr, about 30 mTorr, or about 40 mTorr) and a temperature ranging from about 50° C. to about 120° C.

Further, in operation 305, vertical structures 902 are formed. For example, vertical structures 902 can be formed as described with reference to FIGS. 3C-3F. In referring to FIG. 3C, the process of forming vertical structures 902 (shown in FIG. 3F) can include depositing seed layer 602 over recess structures 410 (shown in FIG. 3B). Seed layer 602 can be in contact with side surfaces of vertical structures 402. In some embodiments, seed layer 602 can be in contact with a top surface and side surfaces of pattern hard mask layers 506. In other embodiments, patterned hard mask layer 506 may be removed from the surface of the uppermost sacrificial layer 404 and the seed layer 602 maybe deposited over the exposed surfaces of the uppermost sacrificial layer 404. Seed layer 602 can include any suitable semiconductor material, such as SiGe, and can be deposited using any suitable deposition process, such as CVD or ALD. In referring to FIG. 3D, the process of forming vertical structures 902 can include depositing (e.g., conformally) a liner layer and a dielectric stack 142 over vertical structures 402 and patterned hard mask layer 506 (if present), polishing (e.g., CMP) the liner layer and the dielectric stack, and recessing the polished liner and the dielectric stack (e.g., an inactive fin) to form recess structure 710 between vertical structures 402 via an etching process. The etching process for forming recess structures 710 can form liners 704 and dielectric stack 142 illustrated in the structure of FIG. 3D. The material, the deposition process, the polishing process, and the etching process associated with the liner layer and the dielectric stack 142 can be similar to those used to form STI regions 104. In some embodiments, dielectric stack 142 can have a height $H_6$ ranging from about 10 nm to about 100 nm. In some embodiments, dielectric stack 142 can have a height $H_6$ ranging from about 20 nm to about 80 nm.

The process of forming vertical structure 902 can further include depositing an insulating dielectric layer into recess structures 710, polishing the insulating dielectric layer to form insulating block 144 (shown in FIG. 3E) over dielectric stack 142, and etching patterned hard mask layer 506 (when present as shown in FIG. 3F). Insulating block 144 forms a dielectric feature above and over dielectric stack 142. The dielectric feature extends away from an upper surface of the dielectric stack 142. In some embodiments, a portion of seed layer 602 can be removed during polishing the insulating dielectric layer to form seed layer 802 in FIG. 3E. The insulating dielectric layer can include a high-k material or any other suitable dielectric material which has high selectivity (e.g., larger than 1) to dielectric stack 142. For example, the insulating dielectric layer can include materials such as silicon oxycarbide (SiOC), silicon oxynitride (SiON), silicon oxy-carbon nitride (SiOCN), or silicon carbonitride (SiCN). It has been observed that when an insulating dielectric layer is deposited into recess structures 710 having an aspect ratio above a particular threshold, e.g., greater than 1.5 or more, or greater than 2 or more, seams or voids are present in the deposited insulating dielectric layer. Such seams or voids can result in rejection of the formed device which adversely affects product yield. In addition the presence of such seams or voids negatively affects the ability of the insulating dielectric material to protect features of the underlying dielectric stack 142, seed layer 602 or liner 704. In accordance with embodiments of the present disclosure, the insulating dielectric layer is deposited in recess structure 710 utilizing a plurality of alternating deposition and etching processes as described below. In accordance with embodiments of the present disclosure, recess structures 710 have a depth ranging from about 5 to 50 nm and a width ranging from about 5 to 50 nm. In other embodiments, recess structures 710 have a depth ranging from about 5 to 30 nm and a width ranging from about 5 to 30 nm.

Figure 6E:
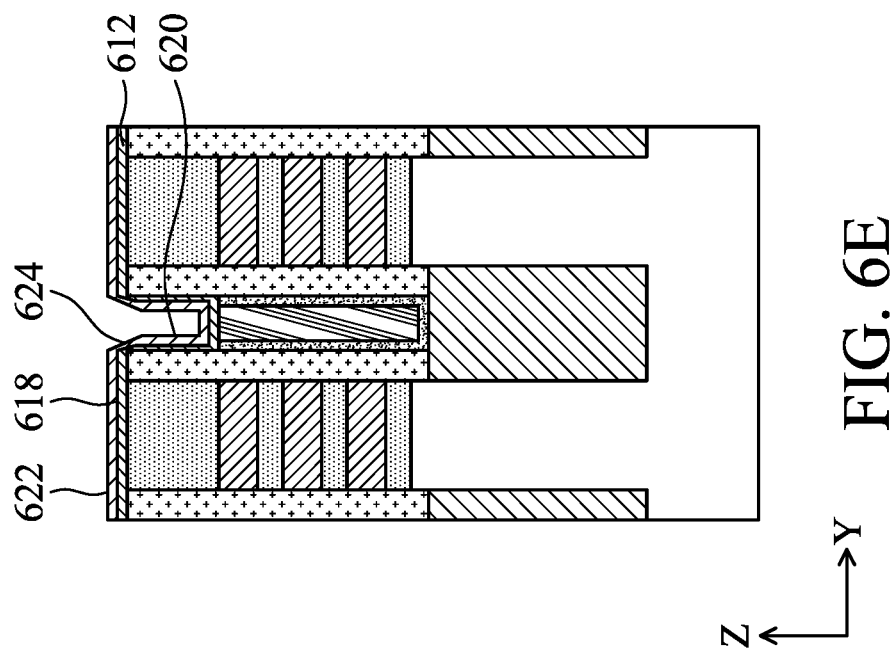

Referring to FIGS. 3D and 6A, in accordance with an embodiment, the insulating dielectric layer is deposited into recess structure 710 utilizing a plurality of repetitive deposition and etching steps described below with reference to FIGS. 6B-6E. For example, in some embodiments, such as illustrated in FIGS. 6B-6E, at least two repetitive cycles of deposition and etching are carried out. In other words, in accordance with such embodiments, the sequence of deposition and etching is as follows: deposition, etching, deposition, etching. In other embodiments, more than two repetitive deposition and etching steps are carried out. Embodiments in accordance with the present disclosure are not limited to one sequence of the repetitive etching and deposition steps being carried out under identical conditions as another subsequent repetitive etching and deposition sequence. In other words, conditions under which the etching and deposition steps are carried out in the respective etching and deposition sequences can differ.

Referring to FIG. 6B, in one embodiment, the deposition of a first insulating dielectric layer 610 is accomplished using methods suitable for flowable dielectric materials (e.g., flowable silicon oxide). For example, flowable silicon oxide can be deposited using a flowable CVD (FCVD) process. The FCVD process can be followed by a wet anneal process. Embodiments in accordance with the present disclosure are not limited to use of FCVD to deposit the insulating dielectric layer, for example, other processes such as other CVD or ALD processes can be utilized. In an embodiment, when an ALD process is utilized to deposit the insulating dielectric layer 610 into recess structure 710 that forms insulating block 144 in FIG. 3E, the ALD process is carried out under conditions that result in the deposition of the insulating dielectric layer 610 that has a thickness that results in a ratio of a thickness of the deposited insulating dielectric material removed by the etching step described below in more detail and a thickness of the insulating dielectric material deposited by the depositing step that is between about 1:4 and 1:1. In some embodiments, the thickness of the deposited insulating dielectric layer 610 in a single deposition step is about 5 to 8 nm. Embodiments in accordance with the present disclosure are not limited to deposition steps that deposit 5 to 8 nm of the insulating dielectric layer 610 in a single deposition step. For example, in other embodiments, the insulating dielectric layer 610 deposited in a single deposition step of the plurality of repetitive deposition and etching cycles is less than 5 nm thick or more than 8 nm. In one embodiment, the thickness of the deposited insulating dielectric layer 610 that is etched in a single etching step of the plurality of repetitive deposition and etching cycles is an amount that results in a ratio of a thickness of the deposited insulating dielectric layer 610 removed by the etching step and a thickness of the insulating dielectric material deposited by the depositing step that is between about 1:4 and 1:1. In some embodiments, the thickness of the deposited insulating dielectric layer 610 removed in a single etching step is between about 2 to 5 nm. Embodiments in accordance with the present disclosure are not limited to etching steps that remove 2 to 5 nm of the insulating dielectric layer 610. For example, in other embodiments, the thickness of the deposited insulating dielectric layer 610 that is removed by a single etching step is less than 2 nm or greater than 5 nm.

Referring to FIG. 6C, etching or removal of a portion of the deposited insulating layer 610, in one embodiment, is accomplished by contacting the deposited insulating layer 610 with a mixture of sulfuric acid (e.g., 96 wt % sulfuric acid) and hydrogen peroxide (e.g., 30 wt % hydrogen peroxide) (SPM). Examples of a suitable SPMs are characterized by a volume ratio of sulfuric acid to hydrogen peroxide that is between 1:4 and 4:1. Embodiments in accordance with the present disclosure are not limited to use of SPMs that have a volume ratio of sulfuric acid to hydrogen peroxide between 1:4 and 4:1. For example, in other embodiments, SPMs having a volume ratio of sulfuric acid to hydrogen peroxide that is less than 1:4 or greater than 4:1 can be used. In accordance with some embodiments, the SPM is contacted with the deposited insulating dielectric layer for a period of between 1 to 10 minutes. In some embodiments, the contacting of the SPM with the deposited insulating dielectric layer 610 is carried out at temperatures between about 50° C. to 180° C. Embodiments in accordance with the present disclosure are not limited to contacting the SPM with the deposited insulating dielectric layer for these described periods of time at these described temperatures. For example, in accordance with other embodiments, the SPM is contacted with the deposited insulating dielectric layer for a period of time less than one minute or a period of time greater than 10 minutes. In other embodiments, the SPM is contacted with the deposited insulating dielectric layer 610 at temperatures less than 50° C. and temperatures greater than 180° C. Generally, as the temperature at which the SPM is contacted with the deposited insulating dielectric layer is increased, the length of time of the contacting can be decreased and vice versa. The volume ratio of sulfuric acid to hydrogen peroxide of the SPM will also affect the length of time and temperature for the etching process. Typically, as the ratio of sulfuric acid to hydrogen peroxide of the SPM increases, the length of time of the etching step can decrease, the temperature of the etching step can decrease, or both, and the same amount of etching will still be achieved.

In accordance with other embodiments, the SPM can be diluted with water. For example, the SPM can be diluted with water at a ratio of 1:1 up to 1:10 depending upon the ratio of the sulfuric acid to hydrogen peroxide of the undiluted SPM. Embodiments in accordance with the present disclosure are not limited to diluting the SPM at a ratio in the range of 1:1 up to 1:10. For example, in other embodiments, the SPM can be diluted at a ratio less than 1:1 or a ratio greater than 1:10.

In some embodiments as illustrated in FIG. 6C, the etched first layer 612 includes a sloped transition 614 between a surface of vertical portions 611 and a surface of horizontal portions 613 of dielectric material layer 610. Such sloping of surface 614 is a function of the rate of etching at surface 614 compared to the rate of etching at the surfaces of the horizontal portions 611 and the vertical portions 613 and the shape of layer 610 prior to etching.

Figure 5:
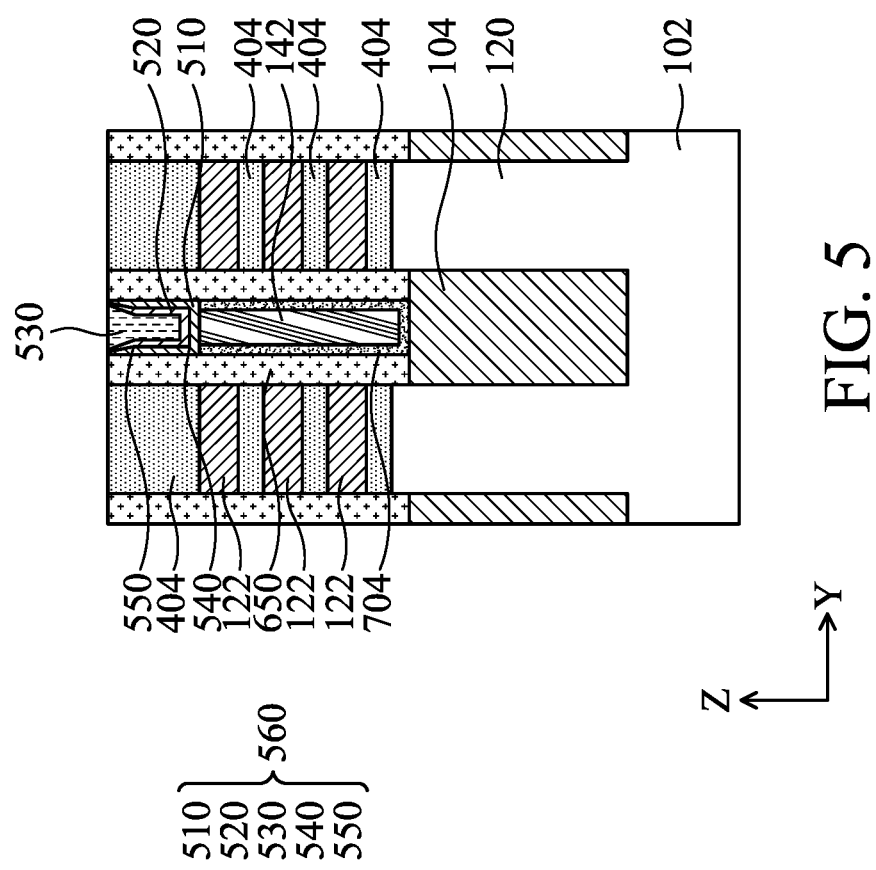
FIG. 5 is an enlarged view of an IC device of FIG. 3E illustrating multiple layers within an insulating block and interfaces between the multiple layers.
Figure 6D:
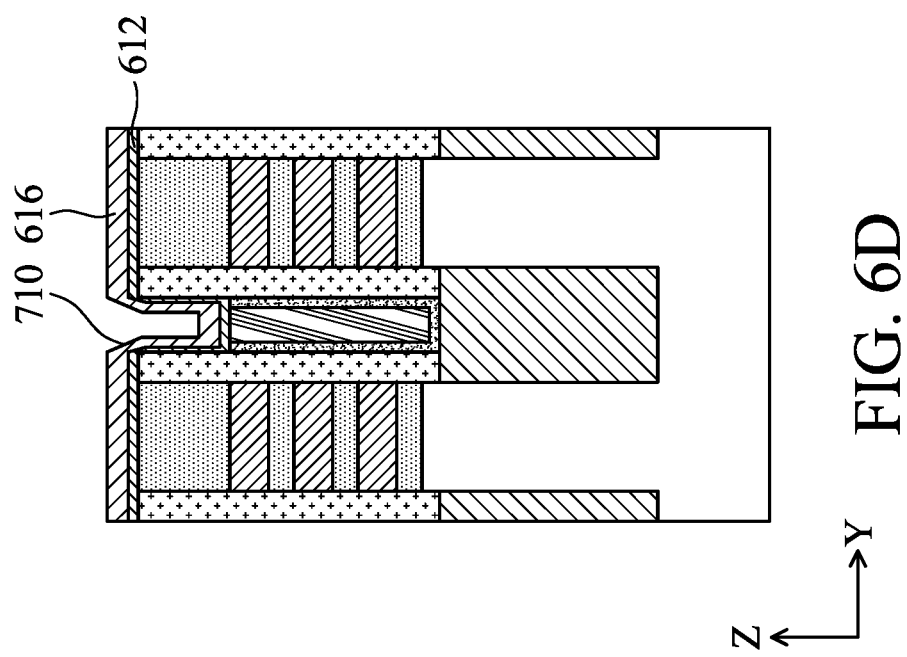

Referring to FIG. 6D, in accordance with an embodiment of the present disclosure, a second dielectric material layer 616 is deposited over the etched first layer 612 of dielectric material. The description above regarding the deposition of first dielectric layer 610 is applicable to the deposition of second dielectric material layer 616. Second layer of dielectric material 616 is then etched to produce an etched second dielectric material layer 618. The description above regarding etching of first dielectric material layer 610 is applicable to the etching of second dielectric material layer 616. In the embodiment illustrated in FIG. 6D, the second dielectric material layer 618 includes a sloped surface 624 at the transition from a vertical portions 620 and a horizontal portions 622 of etched second dielectric material layer 618. In accordance with the embodiments of FIGS. 6A-6E, at least one additional cycle of dielectric material deposition and dielectric material etching is carried out prior to planarization in order to complete formation of dielectric feature 560 in FIG. 5. In accordance with embodiments of the present disclosure, the combination of deposition of a single layer of the insulating dielectric material and etching of the deposited single layer of dielectric material layer defines a cycle of formation of insulating block 144/dielectric feature. In accordance with embodiments of the present disclosure, this cycle is repeated at least twice and in other embodiments more than two times in order to form sequentially a plurality of layers of the dielectric material which ultimately form a dielectric feature free of seams and voids. Formation of a dielectric feature free of seams and voids reduces the number of wafers that are rejected due to the presence of seams or voids in the dielectric feature. As noted above, the presence of seams or voids in the dielectric feature can result in rejection of the device which includes the dielectric feature with seams or voids. In addition, the presence of seams or voids in the dielectric feature negatively impacts the ability of the dielectric feature to protect features underlying the dielectric feature, for example, the dielectric stack 142, seed layer 602 or liner 704.

Referring to FIG. 5, in accordance with an embodiment of the present disclosure, the dielectric feature 560 forms an upper portion of a gate isolation feature and includes a plurality of layers 510, 520 and 530 of dielectric material and a plurality of interfaces 540 and 550. Each of the layers 510, 520 and 530 is formed by a deposition step and a subsequent etching step. This results in an interface 540 between layers 510 and 520 and an interface 550 between layers 520 and 530. Embodiments in accordance with the present disclosure are not limited to a dielectric feature that includes three layers and two interfaces. In accordance with other embodiments, more layers and more interfaces may be present. In accordance with embodiments of the present disclosure an interface between two layers of the dielectric material is characterized by the presence of elemental oxygen or elemental nitrogen. This elemental oxygen or nitrogen can be detected using various techniques including energy dispersive x-ray spectroscopy or other similar technique. The presence of the elemental oxygen or elemental nitrogen at these interfaces is believed to be a result of the deposition and/or etching of the dielectric material of the insulating dielectric layer being carried out in the presence of oxygen or nitrogen.

Figure 7:
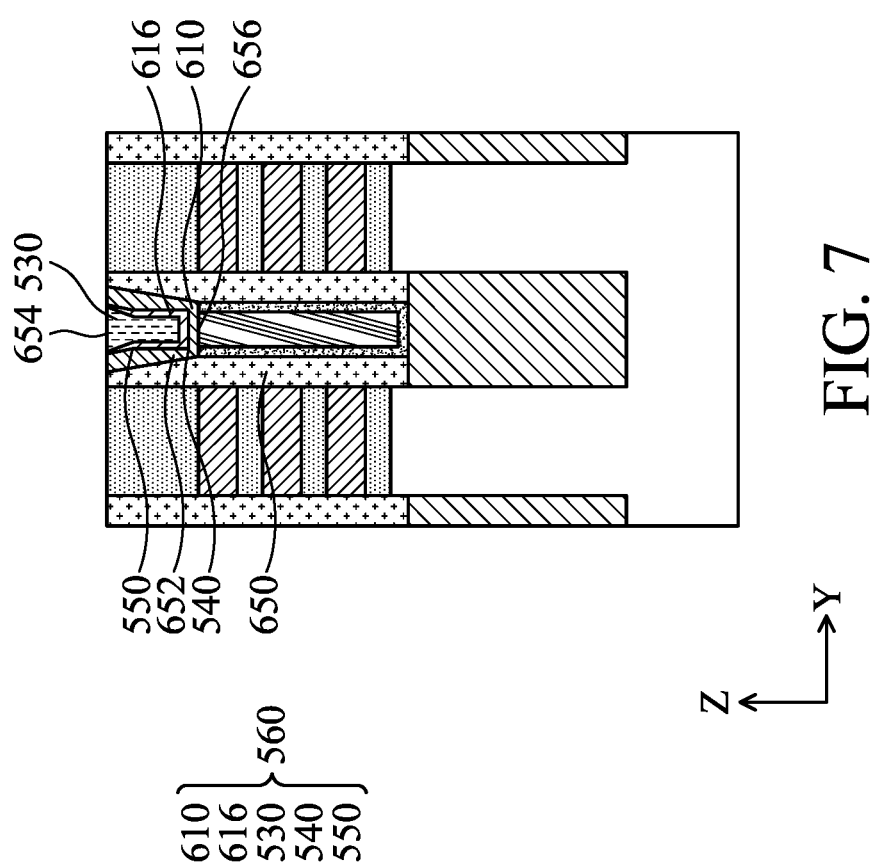
FIG. 7 is an enlarged view of an alternative embodiment of the IC device at an intermediate stage of fabrication according an embodiment of the present disclosure.

Referring to FIG. 7, illustrates an alternative embodiment in accordance with the present disclosure. In accordance with embodiments of FIG. 7, features that are in common with FIGS. 5 and 6A-6E are identified by the reference numbers used in FIGS. 5 and 6A-6E. The description of these common features is not reproduced here. For the embodiment illustrated in FIG. 7, the description above regarding deposition of layers 610 and 616 with reference to FIGS. 6A-6E is also applicable to deposition of layers 610, 616 and 530 of dielectric plug 560 illustrated in FIG. 7. In accordance with the embodiment illustrated in FIG. 7, etching of first dielectric material layer 610 described above with reference to FIGS. 6B and 6C not only etches a portion of first dielectric material layer 610 at surface 614 in FIG. 6C located at the transition between horizontal portions 612 and vertical portions 613 position, but also etches/removes a portion of underlying fin side wall spacer 650 at a transition between vertical and horizontal portions of fin side wall spacer 650. The degree to which a portion of underlying fin side wall spacer 650 is etched may vary. For example, in the embodiment illustrated in FIG. 7, the vertical portion of fin side wall spacer 650 is etched to a varying degree along its entire length, thus producing a sloped surface 652. In other embodiments less than the entire length of vertical portion of fin side wall spacer 650 is removed. The result of etching underlying fin side wall spacer 650 along an entire length of its vertical portion 613 is that dielectric feature 560 has a width that is greater at its upper surface 654 than the width of the dielectric feature 560 at its lower surface 656. In other embodiments, the entire length of vertical portion 613 of underlying fin side wall spacer 650 is not etched and only a portion of the length of vertical's portion 613 is etched. In such other embodiments, dielectric feature 560 includes a width at its upper surface 654 that is greater than its width at lower surface 656.

Figure 3E:
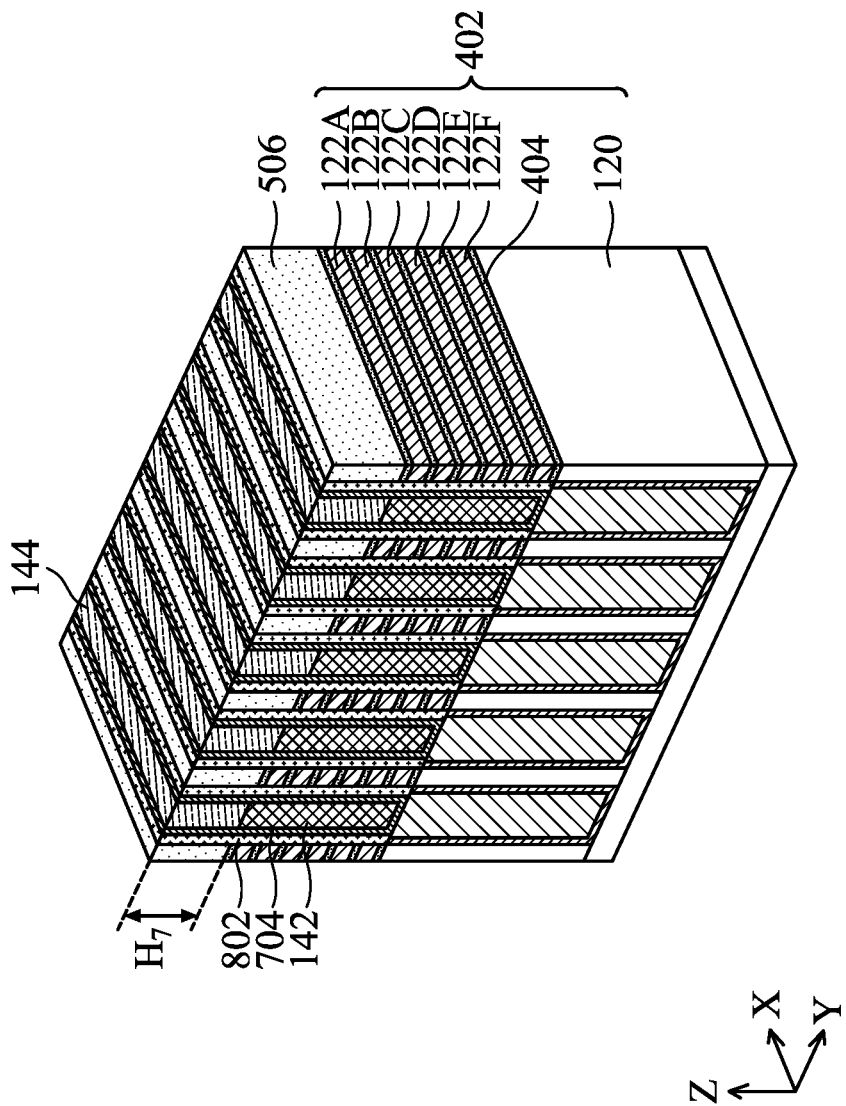
Figure 3F:
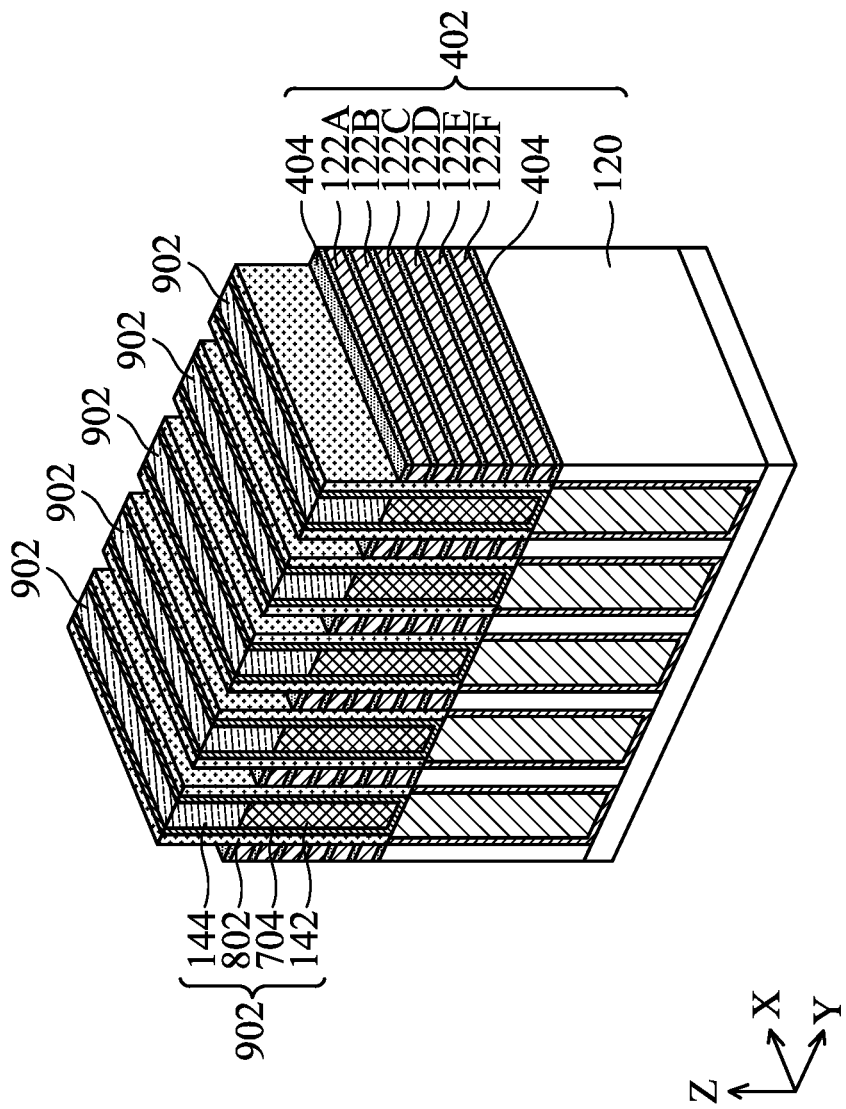
Figure 3G:
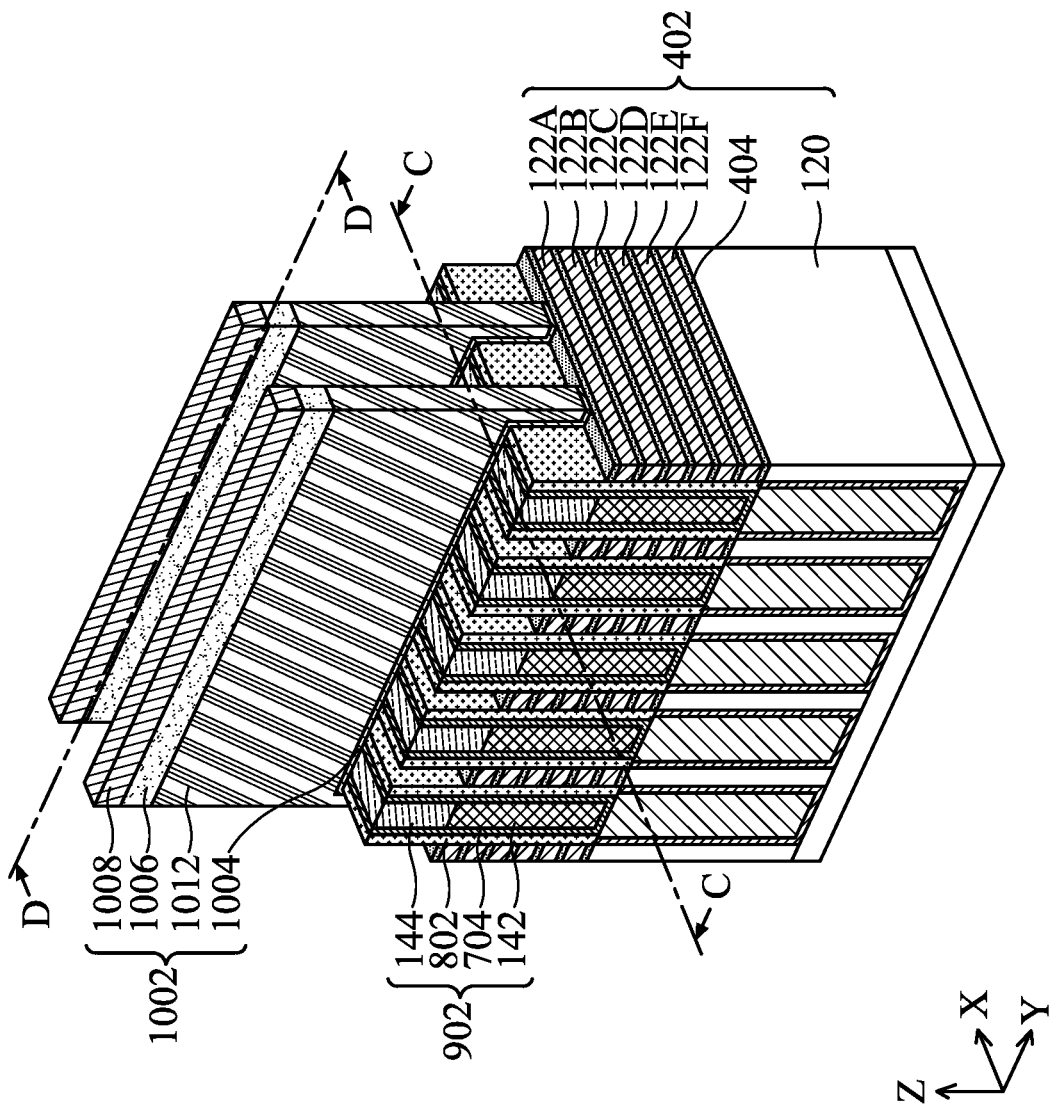

As illustrated in FIG. 3E, a top surface of insulating block 144 can be substantially coplanar to a top surface of patterned hard mask layer 506 after the polishing. Namely, insulating block 144 can have a height $H_7$ that can be determined based on a height of patterned hard mask layer 506 or in other embodiments, the height of the uppermost sacrificial layer 404. In some embodiments, insulating block 144 can have a height $H_7$ substantially similar to that of hard mask layer 506 or the uppermost sacrificial layer 404. In some embodiments, insulating block 144 can have a height $H_7$ ranging from about 1 nm to about 50 nm, or from about 4 nm to about 30 nm. In some embodiments, a ratio between dielectric stack 142's height $H_6$ (shown in FIG. 3D) and insulating block 144's height $H_7$ can range from about 0.05 and 20, or from about 0.125 and 8.

In referring to FIG. 3F, patterned hard mask layer 506 or the uppermost sacrificial layer 404 can be selectively removed from the fabricated structure shown in FIG. 3E. The etching of patterned hard mask layer 506 can use any suitable wet etching process or dry etching process that has high selectivity (e.g., larger than 1) to sacrificial layer 404, e.g., of SiGe, and insulating block 144. In other embodiments, where the thicker uppermost sacrificial layer 404 is present, the etching of patterned hard mask layer 506 can use any suitable wet etching process or dry etching process that has high selectivity (e.g., larger than 1) to sacrificial layer 404, e.g., of SiGe, and insulating block 144. In other embodiments, the etching of the patterned hard mask and FIG. 3F uses an etching process that does not have high selectivity relative to sacrificial layer 404 such that the uppermost sacrificial layer 404 is removed, thus exposing the underlying channel layer 122A. In some embodiments, the etching process for removing patterned hard mask layer 506 does not substantially change insulating block 144's height $H_7$. In some embodiments, after forming insulating block 144, each vertical structure 902 can include liner 704, dielectric stack 142, and insulating block 144 formed over dielectric stack 142. In some embodiments, after forming insulating block 144, each vertical structure 902 can include seed layer 802, dielectric stack 142, liners 704 that are in contact with seed layer 802 and dielectric stack 142, and insulating block 144 formed over dielectric stack 142.

Figure 3I:
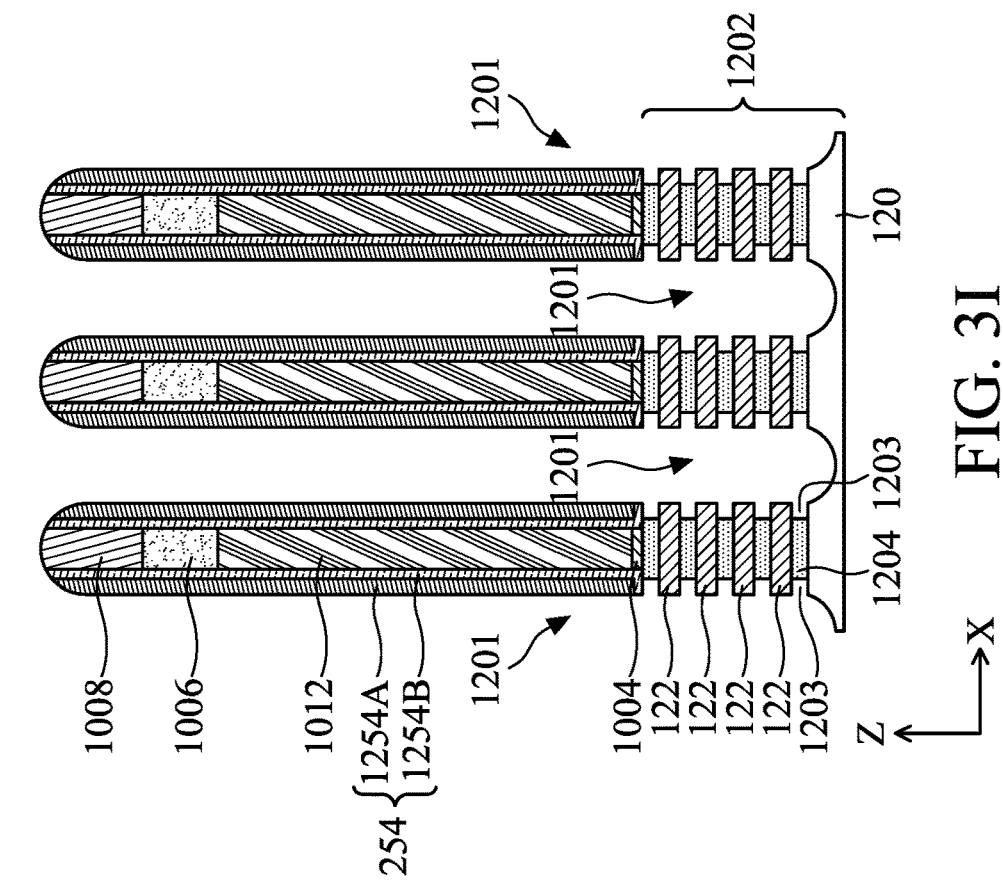
Figure 3H:
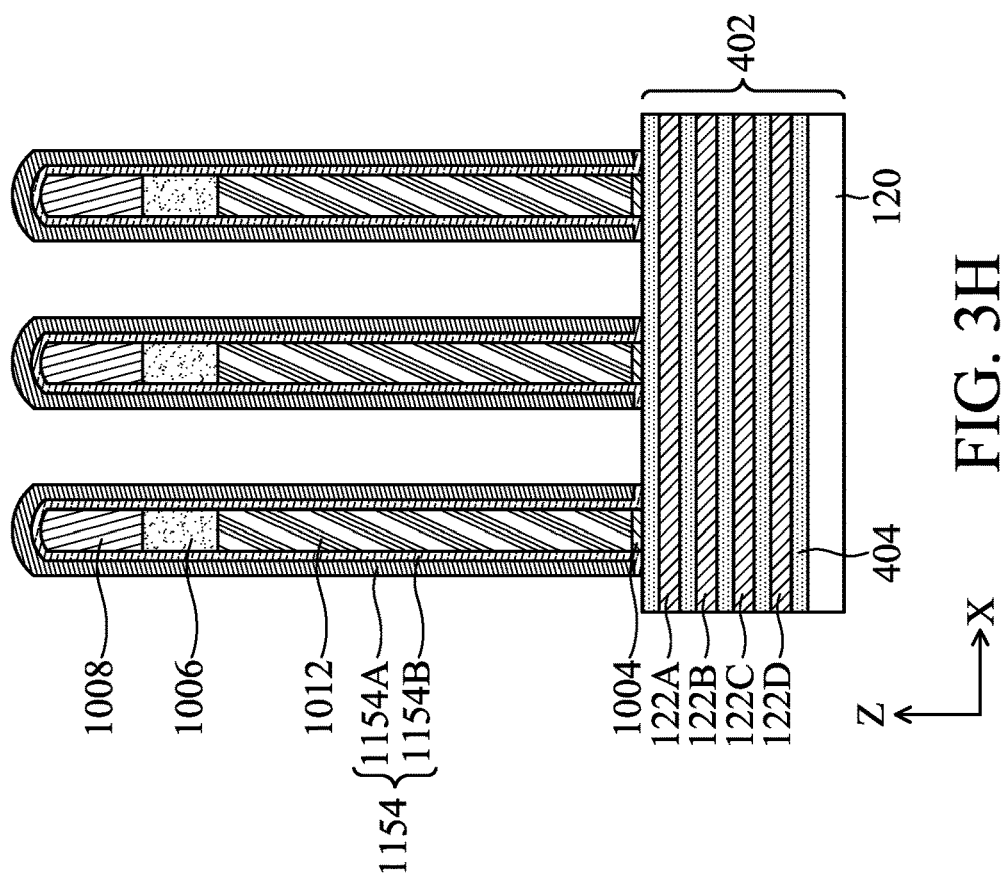
Figure 3L:
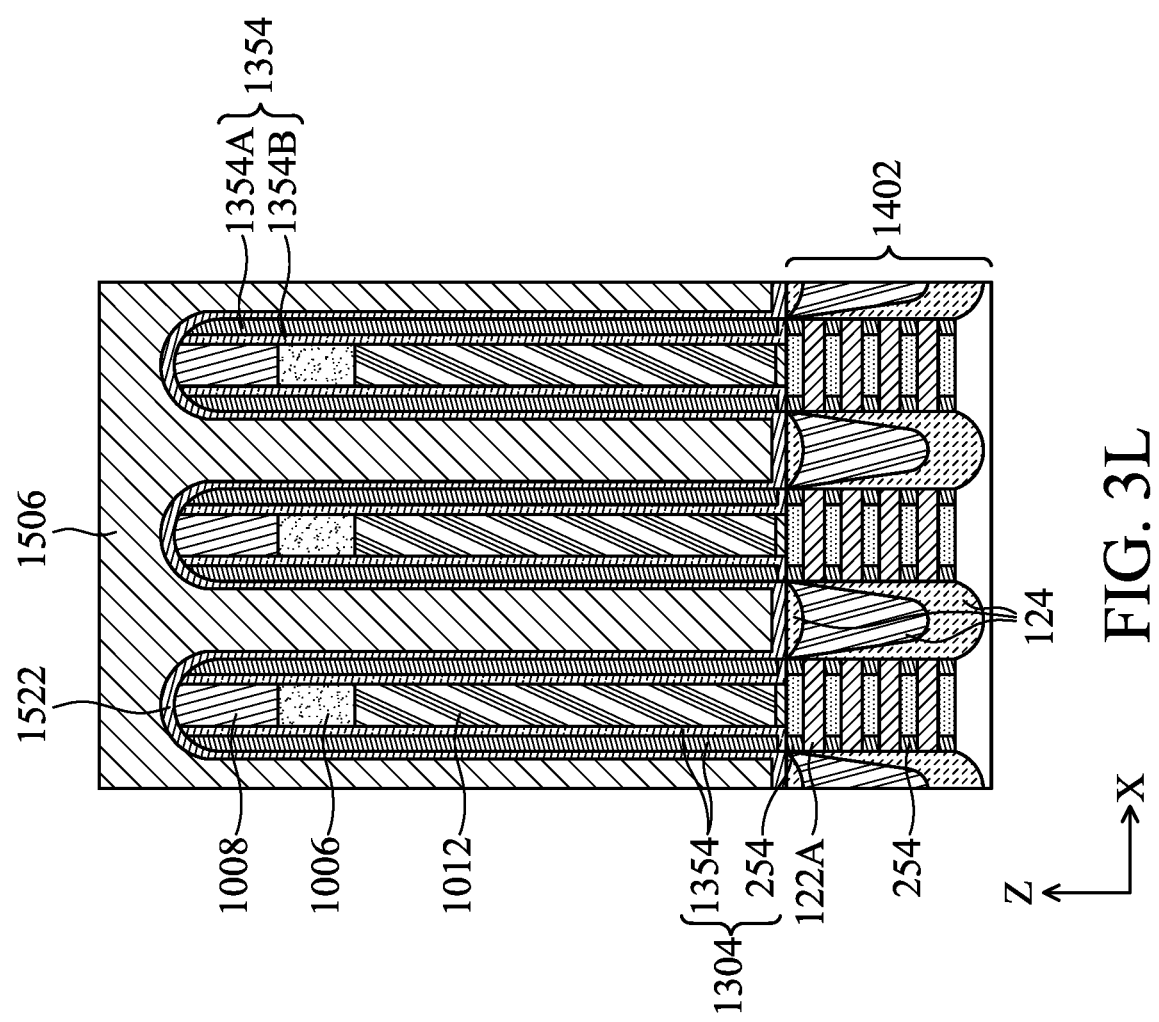
Figure 3M:
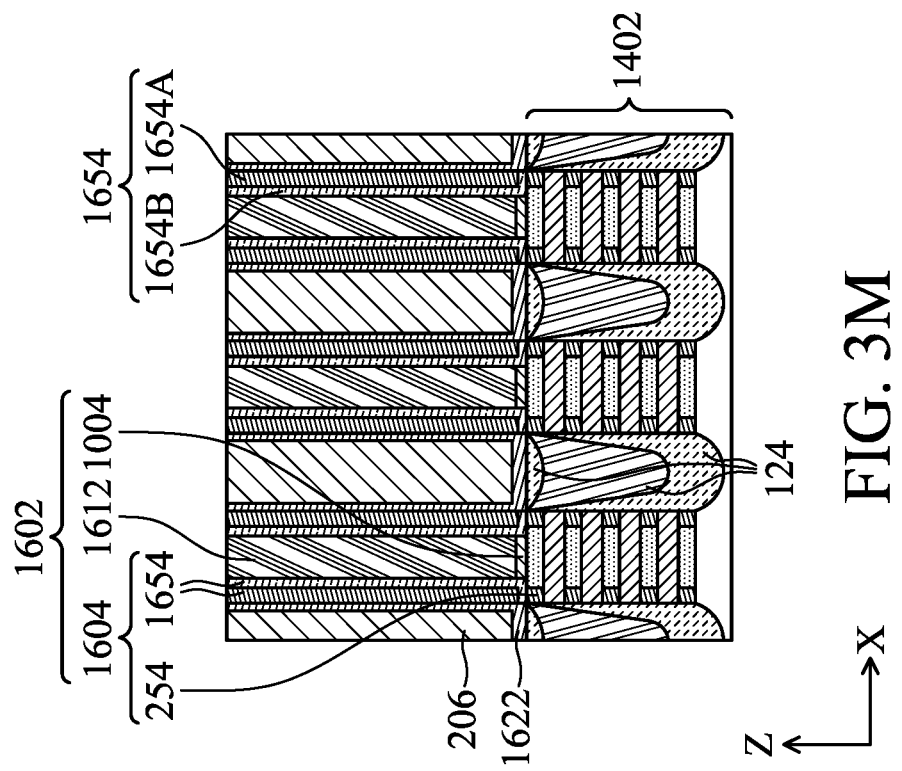

Referring to FIG. 2, in operation 310, a first gate structure is formed over the first and the second vertical structures. For example, as shown in FIG. 3M, multiple gate structures 1602 are formed on vertical structures 1402. FIGS. 3G-3M are isometric and/or cross-sectional views of partially fabricated structures that can be used to describe the fabrication stages of operation 310. In referring to FIG. 3G, multiple sacrificial gate structures 1002 can be formed along a horizontal direction (e.g., y-axis) perpendicular to a longitudinal direction of vertical structures 402 (e.g., fin stacks) and 902. Sacrificial gate structure 1002 can include a sacrificial gate dielectric 1004 and a sacrificial gate electrode 1012. In some embodiments, a vertical dimension of sacrificial gate electrode 1012 can be in a range from about 90 nm to about 200 nm. Although FIG. 3G shows two sacrificial gate structures 1002, any number of sacrificial gate structures 1002 can be formed parallel to each other. In some embodiments, sacrificial gate structure 1002 can further include capping layer 1006 and hard mask layer 1008. By way of example and not limitation, sacrificial gate dielectric 1004 can be deposited prior to deposition of sacrificial gate electrode 1012 and can be interposed between vertical structures 402 and sacrificial gate electrode 1012. In some embodiments, sacrificial gate dielectric 1004 can be interposed between vertical structures 902 and sacrificial gate electrode 1012. According to some embodiments, sacrificial gate dielectric 1004 can include a low-k dielectric material, such as silicon oxide or silicon oxynitride, and sacrificial gate electrode 1012 can include polycrystalline silicon (polysilicon). By way of example and not limitation, sacrificial gate dielectric 1004 and sacrificial gate electrode 1012 can be deposited as blanket layers using any suitable deposition process (e.g., PVD or CVD) and patterned with lithography and etching operations to form sacrificial gate structure 1002 over vertical structures 402 and 902.

Further, in operation 310, spacer structures 1304 can be formed (shown in FIG. 3J), as described with reference to FIG. 3H-3J. In referring to FIG. 3H, the process of forming spacer structures 1304 can include forming a gate spacer 1154 over sacrificial gate structure 1002. FIG. 3H is a cross-sectional view of the structure along line C-C of FIG. 3G after forming gate spacer 1154 over sacrificial gate structure 1002. Although FIG. 3H shows four channel layers 122A-122D, any number of channel layers can be included in each vertical structure 402. In addition, although gate spacer 1154 in FIG. 3H includes two spacer layers (spacers 1154A and 1154B), any number of spacer layers can be included in gate spacer 1154. The process of forming gate spacer 1154 can include a surface treatment and a deposition of spacer material. In some embodiments, the surface treatment can include exposing sacrificial gate structure 1002 to an inhibitor to form H- or F-terminated surfaces on the sidewalls of sacrificial gate structure 1002. The H- or F-terminated surfaces can facilitate the deposition of the spacer material. The spacer material can be deposited using, for example, CVD or ALD. The surface treatment can be performed before or during the deposition process. The deposition process can be followed by, for example, an oxygen plasma treatment to remove a hydrophobic component on sacrificial gate structure 1002. In some embodiments, the spacer material can include (i) a dielectric material, such as silicon oxide, silicon carbide, silicon nitride, and silicon oxy-nitride, (ii) an oxide material, (iii) a nitride material, (iv) a low-k material, or (v) a combination thereof. In some embodiments, the spacer material of each spacer layer (e.g., spacer 1154A and 1154B) of gate spacer 1154 can be same or different from each other. The process of forming gate spacer 1154 can further include an etching process to remove a portion of the deposited spacer material. In some embodiments, the etching process can be an anisotropic etch that removes the spacer material faster on horizontal surfaces (e.g., on the x-y plane) compared to vertical surfaces (e.g., on the y-z or x-z planes). In some embodiments, each spacer 1154A and 1154B can have a thickness in a range from about 2 nm to about 5 nm.

After forming gate spacer 1154, multiple recess structures 1201 can be formed along each vertical structure 402 to form vertical structure 1202. For example, as shown in FIG. 3I, a process of forming recess structures 1201 can include removing channel layers within channel region 122, sacrificial layers 404, and buffer region 120 via an etching back process using sacrificial gate structure 1002 and gate spacer 1154 as hard masks. The etching back process can be an etching process using similar techniques as forming recess structures 410. For example, the etching process can be a dry etch process, a wet etch process, or a combination thereof. In some embodiments, the dry etch process can use reactive ion etching using a chlorine or fluorine based etchant. In some embodiments, the process of forming recess structures

1201 can remove a portion of gate spacer 1154 to form gate spacer 1254. For example, spacer 1254A and 1254B can be formed by respectively etching an upper portion of gate spacer 1154A and 1154B (e.g., portions of gate spacer 1154 that is placed at or near sacrificial gate structure 1002's top surface) during the process of forming recess structure 1201. In some embodiments, gate spacer 1254 can be substantially the same as gate spacer 1154 after forming recess structures 1201 (e.g., the etching processes for the process of forming recess structures 1201 has a lower etching rate towards gate spacer 1154).

In some embodiments, the process of forming spacer structures 1304 can further include forming inner spacers 254. The process of forming inner spacer 254 can include forming recess structures 1203 and filling each recess structure 1203 with a spacer material. As shown in FIG. 3I, the process of forming recess structures 1203 can include recessing sacrificial layers 404 under sacrificial gate structures 1002 to form sacrificial layers 1204 via a selective etching process. By way of example and not limitation, channels layers within channel region 122 can be Si layers and sacrificial layers 404 can be SiGe layers, where the selective etching process can be a drying etching process that is selective towards SiGe. For example, halogen-based chemistries can exhibit etch selectivity that is higher for Ge and lower for Si. Therefore, halogen gases can etch Ge faster than Si. Further, halogen gases can etch SiGe faster than Si. Thus, the selective etching process can be designed not to remove the channel layers after forming recess structures 1203. In some embodiments, the halogen-based chemistries can include fluorine-based and/or chlorine-based gasses. Alternatively, a wet etch chemistry with high selectivity towards SiGe can be used. By way of example and not limitation, a wet etch chemistry can include a mixture of sulfuric acid ($H_2SO_4$) and hydrogen peroxide ($H_2O_2$) (SPM), or a mixture of ammonia hydroxide with $H_2O_2$ and water (APM). The filling of each recess structure 1203 can include depositing a blanket film in recess structures 1201 and 1203, and removing the blanket film that is outside recess structures 1203. The processes for forming and removing the blanket film can use similar techniques as forming gate spacer 1154. For example, the process of forming the blanket film can include depositing a dielectric material using CVD or ALD; the process of removing the blanket film can include using a dry etch process, a wet etch process, or a combination thereof. In some embodiments, as shown in FIG. 13, each inner spacer 254 can have a thickness $t_1$ range from about 1 nm to about 9 nm.

In some embodiments, the process of forming inner spacer 254 can also remove a portion of gate spacer 1254 to form gate spacer 1354. For example, spacers 1354A and 1354B can be formed by respectively removing an upper portion of spacers 1254A and 1254B during the process of forming inner spacers 254. In some embodiments, gate spacer 1354 can be substantially the same as gate spacer 1254 after forming inner spacers 254. As a result, spacer structure 1304 can include gate spacer 1354 and inner spacers 254.

Referring to FIG. 2, in operation 310, after forming spacer structure 1304, source-drain regions 124 can be formed by epitaxially growing source-drain stacks in recess structures 1201. The epitaxial growth of source-drain regions 124 can use a similar epitaxial growth process as growing channel layers for forming channel region 122 and/or sacrificial layers 404. In some embodiments, the epitaxial growth process can grow at least one SiGe layer or at least one Si layer to form source-drain regions 124. For example, as shown in FIG. 3K, the epitaxial growth process can grow three SiGe layers in recess structures 1201. The epitaxial growth process can in-situ dope source-drain regions 124 using p-type doping precursors or n-type doping precursors. By way of example and not limitation, the p-type doping precursors can include diborane ($B_2H_6$), boron trifluoride ($BF_3$), and the n-type doping precursors can include phosphine ($PH_3$), arsine ($AsH_3$), or other suitable materials. In some embodiments, the epitaxial growth process can form source-drain regions 124, where a top of source-drain regions 124 can be above a top of topmost channel layer (e.g., 122A) within channel region 122. In some embodiments, the epitaxial growth process can form source-drain regions 124, where a top of source-drain regions 124 can be substantially coplanar with a bottom of sacrificial gate structures 1002. In some embodiments, the epitaxial growth process for forming source-drain regions 124 can form vertical structures 1402 from vertical structures 1202, where vertical structure 1402 can be an embodiment of FET 106.

Further, in operation 310, a CESL 1622 and insulating layer 206 can be formed as described with reference to FIGS. 3L-3M. The process of forming CESL 1622 and insulating layer 206 can include depositing a CESL 1522 and an insulating layer 1506 (shown in FIG. 15). CESL 1522 can include silicon nitride, silicon oxynitride, silicon carbide, boron nitride, silicon boron nitride, a composite of boron nitride and silicon carbide, or a combination thereof, and can be formed using any suitable deposition process such as LPCVD, PECVD, CVD, or ALD.

Insulating layer 1506 can be a low-k dielectric material deposited using a deposition method suitable for flowable dielectric materials (e.g., flowable silicon oxide). For example, flowable silicon oxide can be deposited for insulating layer 1506 using FCVD. The process of forming CESL 1622 and insulating layer 206 can further include applying a polishing process (e.g., CMP) to remove a portion of CESL 1522 and a portion of insulating layer 1506. In some embodiments, the polishing process can also remove sacrificial gate structure 1002 to form gate structures 1602. For example, the polishing process can remove hard mask layer 1008, capping layer 1006, an upper portion of sacrificial gate electrode 1012, and an upper portion of gate spacer 1354. As a result, as shown in FIG. 3M, the process of forming CESL 1622 and insulating layer 206 can concurrently form gate structure 1602 that includes sacrificial gate dielectric 1004, sacrificial gate electrode 1612 placed over sacrificial gate dielectric 1004, and spacers 1604 embedding sacrificial gate electrode 1612 and sacrificial gate dielectric 1004, where spacers 1604 can include inner spacers 254 and gate spacer 1654. In some embodiments, the polishing process can remove a portion of gate spacers 1354A and 1354B to respectively form gate spacers 1654A and 1654B. In some embodiments, referring to FIG. 3M, a vertical dimension Hg of gate structure 1602 can be in a range from about 50 nm to about 120 nm.

Continuing to refer to FIG. 2, in operation 315, a recess structure is formed in each of the first gate structures 1602 in FIG. 3M. Such recess structure is formed horizontally (e.g., in the x-direction) between insulating layers 206 (e.g., ILD structure 130) to expose a portion of the insulating layers 206. The process of forming recess structure can include recessing a portion of gate electrode 1612 in FIG. 3M using a dry etching process (e.g., reaction ion etching) or a wet etching process that has a higher etching rate towards gate electrode 1612 and a lower etching rate (e.g., selectivity larger than 1) towards gate spacer 1654 in FIG. 3M (e.g., gate spacers 1654A and 1654B). In some embodiments, the gas etchants used in the dry etching process for removing gate electrode 1612 can include chlorine, fluorine, or bromine. In some embodiments, an NH$_4$OH wet etch can be used to remove the portion of gate electrode 1612. In some embodiments, a dry etch followed by a wet etch can be used to remove the portion of gate electrode 1612.

The process of forming the recess structure can further include removing a portion of spacer 1604 in FIG. 1604 and a portion of gate spacer 1654. In some embodiments, portions of spacer 1654A and a portion of gate spacer 1654B are removed. The process of removing the portion of spacer 1604 can include a dry etching process or a wet etching process that has a low etching rate (e.g., selectivity larger than 1) towards the remaining portion of gate electrode 1612. In some embodiments, the dry etching process or the wet etching process for removing the portion of spacer 1604 can have low etching rate (e.g., selectivity larger than 1) towards CESL 1622 in FIG. 3M or insulating layer 206. In some embodiments, the process of forming the recess structure can also include forming a CESL by removing a portion of CESL 1622 using similar etching process that removes the portion of spacer 1604, such as a dry etch process or a wet etch process that has a higher etching rate towards CESL 1622 and a lower etching rate (e.g., selectivity larger than 1) towards insulating layer 206 and/or gate spacer 1654.

The process of forming the recess structure further includes removing remaining portions of gate electrode 1612 via an etching process that techniques similar to the techniques used to the remove the other portions of gate electrode 1612. For example, the etching process can include a dry etching process (e.g., reactive ion etching) or a wet etching process that has a higher etching rate towards gate electrode 1612 and a lower etching rate (e.g., selectivity larger than 1) towards sacrificial layer 1204. The process of forming the recess structure can further include removing sacrificial gate dielectric 1004 to expose topmost of sacrificial layers 1204 in FIG. 3I via any suitable etching process, such as a wet etching process. The removal of the remaining portions of the gate electrode and sacrificial gate dielectric 1004 can also expose side surfaces of portions of spacer 1304. In some embodiments, portions of spacer 1304 in FIG. 3J can represent a spacer structure. In some embodiments, a portion of spacer 1304 can be removed to form a spacer structure using any suitable etching process, such as a wet etching process or a dry etching process. For example, a portion of the bottom of these spacers can be removed. As a result, each gate structure 1602 can include recess structure that exposes a top of topmost sacrificial layer 1204, the spacer structure's side surfaces, the spacer structure's a top surface, and ILD structure 130's side surfaces of insulating layers 206. In some embodiments, recess structure exposes a topmost channel layer within channel region 122.

Further, in operation 315, after forming the just described recess structure multiple isolation structures are formed. The process of forming isolation structures 108 can include removing one or more insulating blocks 144 from respective one or more vertical structures 902. The process of removing the one or more insulating blocks 144 can include patterning a hard mask stack on a selected vertical structure 902 and etching insulating blocks 144 using the hard mask stack. As a result, after the etching process, the one or more insulating blocks 144 outside the hard mask stack can be removed and other insulating blocks 144 covered by the hard mask stack can remain in vertical structures 902. By way of example and not limitation, the etching of the group of insulating blocks can include any suitable dry etching process or a wet etching process that has low etching rate (e.g., selectivity larger than 1) towards seed layer 802 and/or sacrificial layer 404.

The process of forming isolation structure 108 can further include removing seed layer 802 and removing a portion of liners 704 to expose sidewalls of dielectric stack 142 and/or sidewalls of insulating block 144. The process of removing seed layer 802 can include any suitable etching process that has a higher etching rate towards seed layer 802 and a lower etching rate towards channel regions 122. For example, channel region 122 can include Si, and seed layer 802 can include SiGe. Therefore, seed layer 802 can be removed using a selective etching process that selectively etches SiGe from Si. The process of removing liners 704 can form liner under dielectric stack 142; the removal of liners 704 can be via a dry etch process, a wet etch process, or a combination thereof. In some embodiments, the process of forming isolation structure 108 can also include a trimming process to reduce a width ($W_2$) of isolation structure 108. In some embodiments, isolation structure 108 can have a width $W_2$ equal to or larger than 6 nm, or equal to or larger than 3 nm.

In some embodiments, the process of forming isolation structure 108 can further include removing sacrificial layers 1204 using similar techniques as removing seed layer 802. For example, sacrificial layer 1204 can be removed using a selective etching process that has a higher etching rate towards sacrificial layer 1204 and a lower etching rate towards channel layers 122. As a result, channel layers (e.g., 122A-122D) within channel region 122 can become a nano-sheet structure or a nano-wire structure under each gate structure 1602. In some embodiments, the process of forming the nano-sheet or the nano-wire structure for channel regions 122 can form vertical structures from vertical structures 1202, where the vertical structure can be an embodiment of FET 106. In some embodiments, the vertical structure can be a fin structure (e.g., device 100A is a finFET).

Referring to FIG. 2, in operation 320, the first gate structure 1602 is replaced with a second gate structure 110. The process of replacing gate structure 1602 with gate structure 110 can include filling a dielectric layer and a gate electrode in recess structures between insulating layer 206 of ILD structures 130. The filling of a dielectric layer can include depositing (e.g., conformally) a dielectric layer over ILD structure 130's side surfaces, top surface of the spacer structures, and the spacer structures's side surface. Further, the filling of a dielectric layer can further include depositing (e.g., conformally) a dielectric layer over a top and sides of each insulating block 144, side surfaces of each dielectric stack 142, and a top and sides of each channel layer (e.g., 122A-122D) within channel region 122. In some embodiments, the filling of a dielectric layer can also include depositing (e.g., conformally) a dielectric layer over a top of a group of dielectric stack 142 and a bottom of each channel layers (e.g., 122A-122D) within channel region 122. In some embodiments, the filling of dielectric layer can also include depositing (e.g., conformally) a dielectric layer and a gate electrode over a portion of a top of each STI region 104.

The dielectric layer of gate structure 110 can include silicon oxide and can be formed by CVD, ALD, PVD, e-beam evaporation, or other suitable process. In some embodiments, the dielectric layer can include (i) a layer of silicon oxide, silicon nitride, and/or silicon oxynitride, (ii) a high-k dielectric material, such as hafnium oxide (HfO$_2$), TiO$_2$, HfZrO, Ta$_2$O$_3$, HfSiO$_4$, and ZrO$_2$, ZrSiO$_2$, (iii) a high-k dielectric material having oxides of lithium (Li), beryllium (Be), magnesium (Mg), calcium (Ca), strontium (Sr), scandium (Sc), yttrium (Y), Zr, Al, lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. The High-k dielectric material can be formed by ALD and/or other suitable processes. In some embodiments, the dielectric layer can include a single layer or a stack of insulating material layers.

After the filling of a dielectric layer, the filling of a gate electrode can include depositing a gate electrode over the dielectric layer. The gate electrode can include a single metal layer or a stack of metal layers. The stack of metal layers can include metals different from each other. In some embodiments, a gate electrode can include a suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. The gate electrode can be formed by ALD, PVD, CVD, or other suitable deposition process.

The process of replacing of gate structure 1602 with gate structure 110 can also include planarizing the deposited dielectric layer and gate electrode via a polishing process (e.g., CMP). The polishing process can planarize top surfaces of the dielectric layer and the gate electrode with the top surface of ILD structure 130 (e.g., insulating layer 206).

The process of replacing gate structure 1602 with gate structure 110 can further include recessing a portion of the planarized dielectric layer to form dielectric layer 112, and recessing a portion of the planarized gate electrode. For example, a portion of the planarized dielectric layer and a portion of the planarized gate electrode that are formed over ILD structure 130's side surfaces and a top surface of the spacer structures can be removed by a metal-gate-dielectric etching process. By way of example and not limitation, the metal-gate-dielectric etching process can be any suitable dry etching process and/or any suitable wet etching process that etch both the dielectric layer and the gate electrode.

After forming dielectric layer 112, the process of replacing gate structure 1602 with gate structure 110 can also include forming recess structure for dielectric layer 112 by further recessing an upper portion of the recessed gate electrode to form gate electrode 114 by a metal-gate etching process. By way of example and not limitation, the metal-gate etching process can be any suitable dry etching process and/or any suitable wet etching process that can selectively etch gate electrode from dielectric layer 112 (e.g., etching selectivity larger than 1). For example, the metal-gate etching process can selectively remove the gate electrode, formed over dielectric layer 112's upper portion from dielectric layer 112. After such metal-gate etching process, dielectric layer 112's upper portion can be exposed while dielectric layer 112's lower portion can still be covered by the remaining gate electrode 114. Since the metal-gate etching process has negligible etching effect on dielectric layer 112, after the process of forming gate electrode 114, dielectric layer 112 can remain covering the spacer structure side surfaces. As a result, dielectric layer 112 can protect the spacer structure's integrity during subsequent fabrication steps of integrated circuits, such as forming metal contacts/interconnections.

Further, the metal-gate etching process can be configured to selectively etch the gate electrode from insulating blocks 144. For example, after the process of forming gate electrode 114, gate electrode 114's top surface can be substantially coplanar with or below insulating block 144's top surface. In other words, insulating block 144 can protect the underlying dielectric stack 142 during the process of forming gate electrode 114, thus protecting the dielectric stack's integrity after replacing gate structure 1602 with gate structure 110.

In some embodiments, after the metal-gate etching process that forms gate electrode 114, the process of forming gate electrode 114 can further include growing an upper electrode over gate electrode 114. The upper electrode can include a low resistance metal, such as tungsten, and can be grown via a plating or a deposition using similar techniques that forms gate electrode 114, such as ALD, PVD, and CVD.

Referring to FIG. 2, in operation 325, source/drain contact structures are formed. The process of forming S/D contact structures can include forming S/D contact openings within insulating layer 206 (e.g., ILD structure 130). The process of forming the S/D contact openings can include removing portions of insulating layer 206 that are overlying source-drain regions 124 and removing portions of the CESL under the etched portions of insulating layer 206. The process of removing the portions of insulating layer 206 can include patterning using photolithography to expose areas on top surface of insulating layer 206 corresponding to the portions of insulating layer 206 that are to be removed. The portions of insulating layer 206 can be removed by a dry etching process. The etching of the portions of insulating layer 206 can be followed by a dry etching of portions of the CESL under the etched portions of ILD layer 130. In some embodiments, the dry etching process for removing insulating layer 206 and/or CESL can be a fluorine-based process.

The process of forming S/D contact structures can further include forming metal silicide layers and/or conductive regions within the S/D contact openings. In some embodiments, the metal used for forming the metal silicide layers can include Co, Ti, and Ni. In some embodiments, the metal is deposited by ALD or CVD to form diffusion barrier layers along surfaces of the S/D contact openings. This deposition of diffusion barrier layers is followed by a rapid thermal annealing process at a temperature in a range from about 700° C. to about 900° C. to form the metal silicide layers.

The process of forming conductive regions within the S/D contact openings can include deposition of a conductive material followed by a polishing process to coplanarize top surfaces of the conductive regions with top surfaces of ILD structure 130. The conductive materials can be, for example, W, Al, Co, Cu, or a suitable conductive material, and can be deposited by, for example, PVD, CVD, or ALD. The polishing process for coplanarizing the conductive region with ILD structure 130's top surface can be a CMP process. In some embodiments, the CMP process, can use a silicon or an aluminum abrasive with abrasive concentrations ranging from about 0.1% to about 3%. In some embodiments, the silicon or aluminum abrasive may have a pH level less than 7 for W metal in the conductive regions or can have a pH level greater than 7 for cobalt (Co) or copper (Cu) metals in the conductive regions.

Further, in operation 325, an interconnect structure can be formed over gate structures 110 and the S/D contact structures 124 in FIG. 1. For example, the interconnect structure can be formed over gate structures 110 and the S/D contact structures. In some embodiments, the process of forming the interconnect structure can include depositing a MEOL insulating layer over the S/D contact structures, forming multiple trench openings within the MEOL insulating layer to expose a portion of gate electrode 114 and a portion of the S/D contact structure, and forming a trench conductor into the trench openings and in contact with gate electrode 114 and/or S/D contact structure. In some embodiments, the process of forming the trench opening can use similar techniques as forming the S/D contact openings, such as a photolithography process, a wet etch process, or a dry etch process. In some embodiments, the process of forming trench conductor can use similar techniques as forming the contact regions for the S/D contact structure, such as a deposition process and a polishing process.

Figure 4:
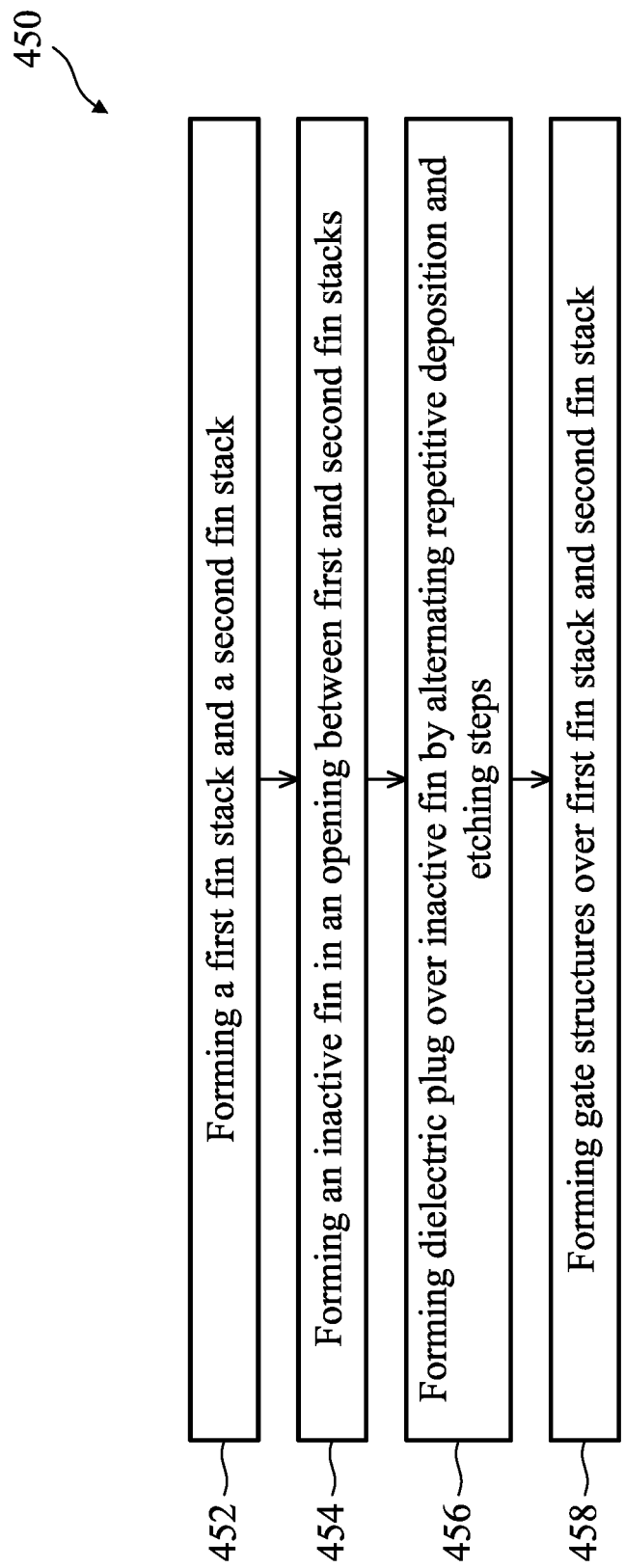
FIG. 4 is a flowchart illustrating a method of fabricating a semiconductor device according to various aspects of the present disclosure.

Referring to FIG. 4, an embodiment of a method 450 in accordance with the present disclosure includes operation 452 of forming a first fin stack and forming a second fin stack. Examples of a forming a first fin stack and a second fin stack include the methods described for forming the multiple vertical structures 402 described above with reference to FIG. 3F. Method 450 includes operation 454 of forming an inactive fin in an opening between the first and second fin stacks. An example of forming an inactive fin in an opening between the first and second fin stacks includes forming isolation structure 108 in FIG. 1 and portions of vertical structure 902 in FIG. 3D. Method 450 includes operation 456 of forming a dielectric feature over the inactive fin by alternating repetitive deposition and etching steps. An example of forming a dielectric feature over the inactive fin by alternating repetitive deposition and etching steps is the process described above for forming insulating block 144. In operation 458 of method 450, gate structures are formed over the first fin stack and the second fin stack. An example of forming gate structures over the first fin stack and the second fin stack include the steps described with respect to forming gate structures 1602 in FIG. 3M.

Figure 8:
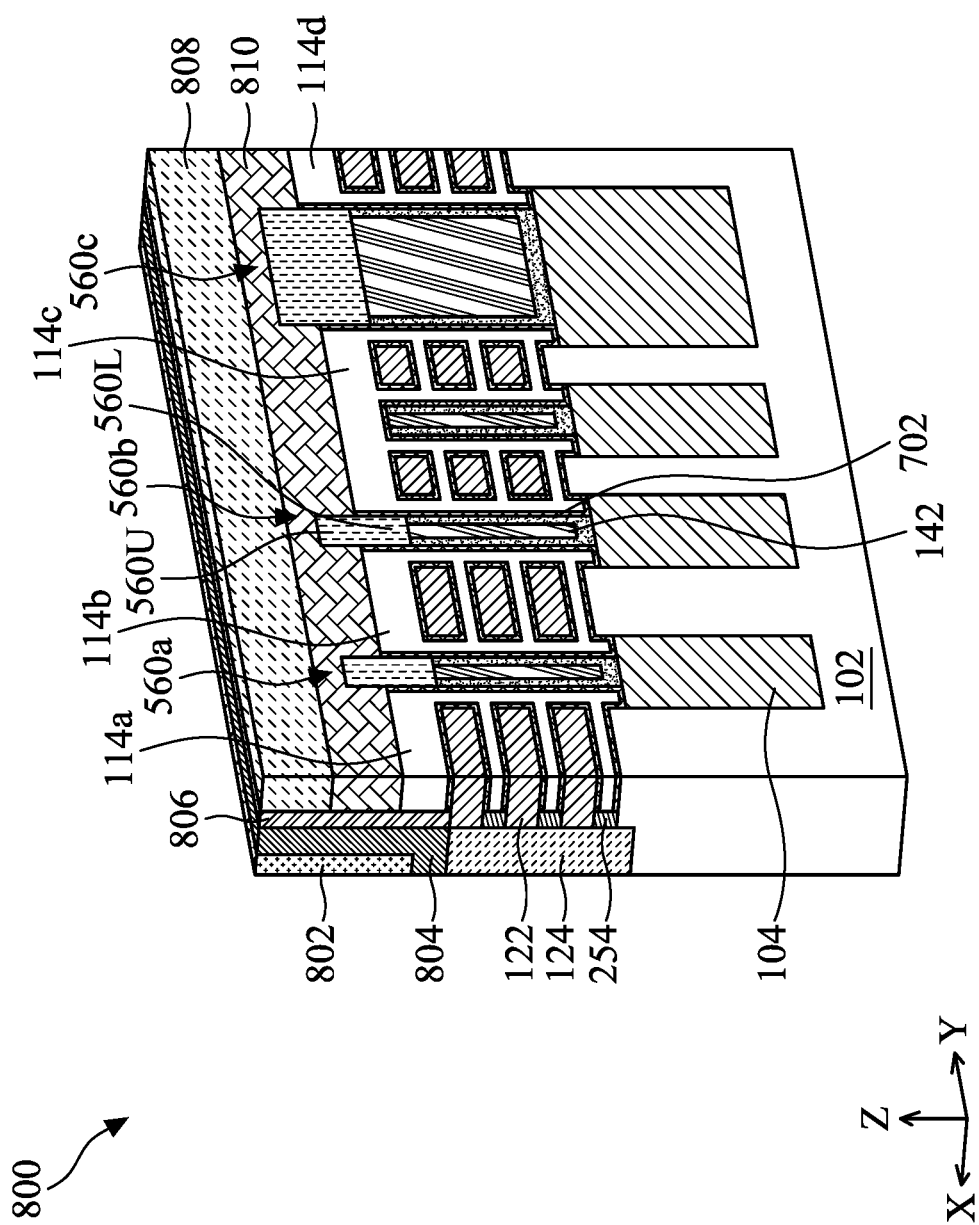
FIG. 8 is a perspective view of an alternative embodiment of an IC device at an intermediate stage of fabrication according an embodiment of the present disclosure.

FIG. 8 is a perspective illustration of another embodiment of an IC device 800 at an intermediate stage of manufacturing. The device 800 of FIG. 8 is similar to the device described above with reference to FIGS. 1-7 and includes three dielectric features 560a, 560b and 560c formed over inactive fin 142 and four metal gate structures 114a-114d isolated in part from each other by the combination of the three dielectric features 560a, 560b and 560c in combination with three of the inactive fins 142. Device 800 includes shallow trench isolation features 104 similar to the shallow trench isolation features 104 described above with reference to FIGS. 1, 3 and 5 formed in substrate 102. Device 800 also includes channels 122, source/drain regions 124, gate electrode 114, liner 702 and a dielectric stack or inactive fin 142, such as those described above with reference to FIGS. 1, 3 and 5. Device 800 at this intermediate stage of manufacturing also includes an interlayer dielectric 802, an etch stop layer 804, a gate spacer 806, an interconnect structure 808 (e.g., MEOL interconnect) and an insulating layer 810 (e.g., MEOL insulating feature). The description of dielectric feature 560 and its formation with reference to FIGS. 1 and 3 applies to dielectric feature 560a-560c of FIG. 8. Dielectric feature 560b of FIG. 8, includes an upper portion 560U within the insulating layer 810. Upper portion 560U is formed in insulating layer 810 by a combination of patterning insulating layer 810, depositing dielectric material into the patterned insulating layer 810, etching the depositing dielectric material and planarizing the etched dielectric material. The formation of upper portion 560U can utilize the cyclical deposition and etching of dielectric material described above with respect to the formation of dielectric feature 560. Dielectric feature 560b also includes a lower portion 560L between gate features 114b and 114c (which includes a metal gate structure that is common to two gate fin structures, e.g., two vertical stacks of nanosheet gate structures. In accordance with some embodiments, lower portion 560L correspondence to the dielectric feature 560 described above. In the embodiment illustrated in FIG. 8, upper portion 560U has a width in the y direction that is less than the width of the lower portion 560L in the y direction. In other embodiments of the present disclosure, upper portion 560U has a width in the Y direction that is greater than the width of the lower portion 560 L in the Y direction. In accordance with embodiments of the present disclosure, end devices formed in accordance with the present disclosure include dielectric feature 560b including upper portion 560U and lower portion 560L having the width characteristics described above. In accordance with embodiments of the present disclosure, the foregoing description regarding upper portion 560U and lower portion 560L of dielectric feature 560b applies equally to dielectric features 560a and 560c. In the illustrated embodiment of FIG. 8, dielectric feature 560a separates and isolates portions of gate structure 114a from portions of gate structure 114b. Similarly, dielectric feature 560c separates and isolates portions of gate structure 114c from portions of gate structure 114d.

In one embodiment of the present disclosure, a device is described that includes a substrate. A first semiconductor channel is over the substrate and a second semiconductor channel, laterally offset from the first semiconductor channel, is over the substrate. A first gate structure is over and laterally surrounds the first semiconductor channel and the second gate structure is over and laterally surrounding the second semiconductor channel. An isolation structure is between the first gate structure and the second gate structure. The isolation structure includes an inactive fin and a dielectric feature extending away from an upper surface of the inactive fin. The dielectric feature is free of voids and includes multiple layers of dielectric material which are formed through alternating deposition and etching steps.

In another embodiment, the devices described include a substrate, a first semiconductor channel over the substrate and a second semiconductor channel over the substrate. The second semiconductor channel is laterally offset from the first semiconductor channel. A first gate structure is over the first semiconductor channel and a second gate structure is over the second gate structure. An inactive fin is between the first gate structure and the second gate structure. A dielectric feature is above the inactive fin and includes multiple layers of a dielectric material. The multiple layers of the dielectric material are formed via three or more atomic layer depositions and include at least one interface between adjacent layers of the multiple layers that is characterized by the presence of elemental oxygen or nitrogen.

In another embodiment of the present disclosure, a method includes forming a first fin stack and a second fin stack over a substrate. An inactive fin is formed in an opening between the first fin stack and the second fin stack. A dielectric feature is formed over the inactive fin by depositing a dielectric material over the inactive fin, etching the deposited dielectric material and repeating such depositing and etching steps at least twice. In accordance with this embodiment, a first gate structure is formed over the first fin stack and a second gate structure is formed over the second fin stack wherein the first gate structure is isolated from the second gate structure by the combination of the inactive fin and the dielectric feature.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a substrate;
   a first semiconductor channel over the substrate;
   a second semiconductor channel over the substrate and laterally offset from the first semiconductor channel;
   a first gate structure over and laterally surrounding the first semiconductor channel;
   a second gate structure over and laterally surrounding the second semiconductor channel; and
   an isolation structure between the first gate structure and the second gate structure, the isolation structure including an inactive fin and a dielectric feature extending away from an upper surface of the inactive fin, the dielectric feature free of voids and including multiple layers of dielectric material, the multiple layers of dielectric material formed through alternating deposition and etching steps.

2. The device of claim 1, wherein the dielectric feature has an aspect ratio of greater than or equal to 2 and less than or equal to 10.

3. The device of claim 1, wherein the inactive fin includes a first dielectric feature having a first dielectric constant; and
   a liner layer between the first dielectric feature and the inactive fin and the first gate structure.

4. The device of claim 1, wherein the dielectric feature comprises a high-k dielectric material.

5. The device of claim 1, wherein the dielectric feature comprises a low-k dielectric material.

6. A device, comprising:
   a substrate;
   a first semiconductor channel over the substrate;
   a second semiconductor channel over the substrate and laterally offset from the first semiconductor channel;
   a first gate structure over the first semiconductor channel;
   a second gate structure over the second semiconductor channel; and
   an isolation structure, comprising:
      an inactive fin between the first gate structure and the second gate structure; and
      a dielectric feature above the inactive fin, the dielectric feature including multiple layers of a dielectric material, the multiple layers of dielectric material formed via three or more atomic layer depositions and including at least one interface between adjacent layers of the multiple layers characterized by a presence of elemental oxygen or nitrogen.

7. The device of claim 6, wherein the first semiconductor channel is laterally offset from the second semiconductor channel by a distance between 5 and 30 nanometers.

8. The device of claim 6, wherein the dielectric feature is formed in a recess having an aspect ratio between 2:1 and 6:1.

9. The device of claim 6, wherein the first semiconductor channel and the second semiconductor channel are nanosheets or nanowires.

10. A method, comprising:
    forming a first fin stack and a second fin stack;
    forming an isolation structure by:
       forming an inactive fin in an opening between the first fin stack and the second fin stack;
       forming a dielectric feature over the inactive fin by:
          depositing a dielectric material over the inactive fin;
          etching the deposited dielectric material; and
          repeating the depositing and etching steps at least twice; and
    forming a first gate structure over the first fin stack and a second gate structure over the second fin stack, wherein the first gate structure is isolated from the second gate structure by the inactive fin and dielectric feature.

11. The method of claim 10, wherein the etching the deposited dielectric material is carried out at a temperature between about 50° C. and 180° C.

12. The method of claim 10, wherein the dielectric material is a high-k dielectric material or is a low-k dielectric material.

13. The method of claim 10, wherein the depositing a dielectric material includes depositing a dielectric material by atomic layer deposition.

14. The method of claim 13, wherein the etching the deposited dielectric material includes contacting the deposited dielectric material with a mixture of sulfuric acid and hydrogen peroxide.

15. The method of claim 14, wherein the mixture of sulfuric acid and hydrogen peroxide has a ratio of sulfuric acid to hydrogen peroxide between 1:4 and 4:1.

16. The method of claim 15, wherein the mixture of sulfuric acid and hydrogen peroxide is diluted in an amount ranging between 1:1 to 1:10.

17. The method of claim 10, wherein the opening has an aspect ratio of greater than or equal to 2 and less than or equal to 10.

18. The method of claim 14, wherein the contacting the deposited dielectric material with the mixture of sulfuric acid and hydrogen peroxide is carried out for between 1 to 10 minutes.

19. The method of claim 18, wherein a ratio of a thickness of the deposited dielectric material removed by the etching and a thickness of the dielectric material deposited by the depositing is between 1:4 and 1:1.

20. The method of claim 10, further comprising incorporating elemental nitrogen or oxygen at an interface between two layers of the deposited dielectric material.

* * * * *